(12) United States Patent
Okhonin

(10) Patent No.: US 8,796,770 B2
(45) Date of Patent: Aug. 5, 2014

(54) SEMICONDUCTOR DEVICE WITH ELECTRICALLY FLOATING BODY

(71) Applicant: Micron Technology, Inc., Boise, ID (US)

(72) Inventor: Serguei Okhonin, Lausanne (CH)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/948,943

(22) Filed: Jul. 23, 2013

(65) Prior Publication Data

US 2013/0308379 A1 Nov. 21, 2013

Related U.S. Application Data

(60) Continuation of application No. 13/547,717, filed on Jul. 12, 2012, now Pat. No. 8,492,209, which is a division of application No. 12/019,320, filed on Jan. 24, 2008, now Pat. No. 8,264,041.

(60) Provisional application No. 60/897,686, filed on Jan. 26, 2007.

(51) Int. Cl.
*H01L 27/12* (2006.01)

(52) U.S. Cl.
CPC ......... *H01L 27/1203* (2013.01); *H01L 27/1207* (2013.01)
USPC ........................................ 257/347

(58) Field of Classification Search
CPC ................. H01L 27/1203; H01L 27/1207
USPC ........... 257/347, 348; 365/182; 438/158, 149, 438/517
See application file for complete search history.

(56) References Cited

U.S. PATENT DOCUMENTS

| | | | |
|---|---|---|---|
| 3,439,214 | A | 4/1969 | Kabell |
| 3,997,799 | A | 12/1976 | Baker |
| 4,032,947 | A | 6/1977 | Kesel et al. |
| 4,250,569 | A | 2/1981 | Sasaki et al. |

(Continued)

FOREIGN PATENT DOCUMENTS

| | | |
|---|---|---|
| CA | 272437 A | 7/1927 |
| EP | 030856 A1 | 6/1981 |

(Continued)

OTHER PUBLICATIONS

Arimoto et al., A Configurable Enhanced T2RAM Macro for System-Level Power Management Unified Memory, 2006, VLSI Symposium, 2 pages.

(Continued)

*Primary Examiner* — Nathan Ha
(74) *Attorney, Agent, or Firm* — Wilmer Cutler Pickering Hale and Dorr LLP

(57) ABSTRACT

A semiconductor device along with circuits including the same and methods of operating the same are described. The device includes an electrically floating body region, and a gate is disposed over a first portion of the body region. The device includes a source region adjoining a second portion of the body region, the second portion adjacent the first portion and separating the source region from the first portion. The device includes a drain region adjoining a third portion of the body region, the third portion adjacent the first portion and separating the drain region from the first portion.

20 Claims, 30 Drawing Sheets

(56) References Cited

U.S. PATENT DOCUMENTS

| | | | |
|---|---|---|---|
| 4,262,340 | A | 4/1981 | Sasaki et al. |
| 4,298,962 | A | 11/1981 | Hamano et al. |
| 4,371,955 | A | 2/1983 | Sasaki |
| 4,527,181 | A | 7/1985 | Sasaki et al. |
| 4,630,089 | A | 12/1986 | Sasaki et al. |
| 4,658,377 | A | 4/1987 | McElroy |
| 4,791,610 | A | 12/1988 | Takemae |
| 4,807,195 | A | 2/1989 | Busch et al. |
| 4,954,989 | A | 9/1990 | Auberton-Herve et al. |
| 4,979,014 | A | 12/1990 | Hieda et al. |
| 5,010,524 | A | 4/1991 | Fifield et al. |
| 5,144,390 | A | 9/1992 | Matloubian |
| 5,164,805 | A | 11/1992 | Lee |
| 5,258,635 | A | 11/1993 | Nitayama et al. |
| 5,313,432 | A | 5/1994 | Lin et al. |
| 5,315,541 | A | 5/1994 | Harari et al. |
| 5,350,938 | A | 9/1994 | Matsukawa et al. |
| 5,355,330 | A | 10/1994 | Hisamoto et al. |
| 5,388,068 | A | 2/1995 | Ghoshal et al. |
| 5,397,726 | A | 3/1995 | Bergemont |
| 5,432,730 | A | 7/1995 | Shubat et al. |
| 5,446,299 | A | 8/1995 | Acovic et al. |
| 5,448,513 | A | 9/1995 | Hu et al. |
| 5,466,625 | A | 11/1995 | Hsieh et al. |
| 5,489,792 | A | 2/1996 | Hu et al. |
| 5,506,436 | A | 4/1996 | Hayashi et al. |
| 5,515,383 | A | 5/1996 | Katoozi |
| 5,526,307 | A | 6/1996 | Yiu et al. |
| 5,528,062 | A | 6/1996 | Hsieh et al. |
| 5,568,356 | A | 10/1996 | Schwartz |
| 5,583,808 | A | 12/1996 | Brahmbhatt |
| 5,593,912 | A | 1/1997 | Rajeevakumar |
| 5,606,188 | A | 2/1997 | Bronner et al. |
| 5,608,250 | A | 3/1997 | Kalnitsky |
| 5,627,092 | A | 5/1997 | Alsmeier et al. |
| 5,631,186 | A | 5/1997 | Park et al. |
| 5,650,956 | A * | 7/1997 | Choi et al. ............... 365/104 |
| 5,677,867 | A | 10/1997 | Hazani |
| 5,696,718 | A | 12/1997 | Hartmann |
| 5,740,099 | A | 4/1998 | Tanigawa |
| 5,754,469 | A | 5/1998 | Hung et al. |
| 5,774,411 | A | 6/1998 | Hsieh et al. |
| 5,778,243 | A | 7/1998 | Aipperspach et al. |
| 5,780,906 | A | 7/1998 | Wu et al. |
| 5,784,311 | A | 7/1998 | Assaderaghi et al. |
| 5,798,968 | A | 8/1998 | Lee et al. |
| 5,811,283 | A | 9/1998 | Sun |
| 5,847,411 | A | 12/1998 | Morii |
| 5,877,978 | A | 3/1999 | Morishita et al. |
| 5,886,376 | A | 3/1999 | Acovic et al. |
| 5,886,385 | A | 3/1999 | Arisumi et al. |
| 5,897,351 | A | 4/1999 | Forbes |
| 5,929,479 | A | 7/1999 | Oyama |
| 5,930,648 | A | 7/1999 | Yang |
| 5,936,265 | A | 8/1999 | Koga |
| 5,939,745 | A | 8/1999 | Park et al. |
| 5,943,258 | A | 8/1999 | Houston et al. |
| 5,943,581 | A | 8/1999 | Lu et al. |
| 5,960,265 | A | 9/1999 | Acovic et al. |
| 5,968,840 | A | 10/1999 | Park et al. |
| 5,977,578 | A | 11/1999 | Tang |
| 5,982,003 | A | 11/1999 | Hu et al. |
| 5,986,914 | A | 11/1999 | McClure |
| 6,018,172 | A | 1/2000 | Hidaka et al. |
| 6,048,756 | A | 4/2000 | Lee et al. |
| 6,081,443 | A | 6/2000 | Morishita et al. |
| 6,096,598 | A | 8/2000 | Furukawa et al. |
| 6,097,056 | A | 8/2000 | Hsu et al. |
| 6,097,624 | A | 8/2000 | Chung et al. |
| 6,111,778 | A | 8/2000 | MacDonald et al. |
| 6,121,077 | A | 9/2000 | Hu et al. |
| 6,133,597 | A | 10/2000 | Li et al. |
| 6,157,216 | A | 12/2000 | Lattimore et al. |
| 6,171,923 | B1 | 1/2001 | Chi et al. |
| 6,177,300 | B1 | 1/2001 | Houston et al. |
| 6,177,698 | B1 | 1/2001 | Gruening et al. |
| 6,177,708 | B1 | 1/2001 | Kuang et al. |
| 6,214,694 | B1 | 4/2001 | Leobandung et al. |
| 6,222,217 | B1 | 4/2001 | Kunikiyo |
| 6,225,158 | B1 | 5/2001 | Furukawa et al. |
| 6,229,161 | B1 | 5/2001 | Nemati et al. |
| 6,245,613 | B1 | 6/2001 | Hsu et al. |
| 6,252,281 | B1 | 6/2001 | Yamamoto et al. |
| 6,262,935 | B1 | 7/2001 | Parris et al. |
| 6,292,424 | B1 | 9/2001 | Ohsawa |
| 6,297,090 | B1 | 10/2001 | Kim |
| 6,300,649 | B1 | 10/2001 | Hu et al. |
| 6,320,227 | B1 | 11/2001 | Lee et al. |
| 6,333,532 | B1 | 12/2001 | Davari et al. |
| 6,333,866 | B1 | 12/2001 | Ogata |
| 6,350,653 | B1 | 2/2002 | Adkisson et al. |
| 6,351,426 | B1 | 2/2002 | Ohsawa |
| 6,359,802 | B1 | 3/2002 | Lu et al. |
| 6,384,445 | B1 | 5/2002 | Hidaka et al. |
| 6,391,658 | B1 | 5/2002 | Gates et al. |
| 6,403,435 | B1 | 6/2002 | Kang et al. |
| 6,421,269 | B1 | 7/2002 | Somasekhar et al. |
| 6,424,011 | B1 | 7/2002 | Assaderaghi et al. |
| 6,424,016 | B1 | 7/2002 | Houston |
| 6,429,477 | B1 | 8/2002 | Mandelman et al. |
| 6,432,769 | B1 | 8/2002 | Fukuda et al. |
| 6,440,872 | B1 | 8/2002 | Mandelman et al. |
| 6,441,435 | B1 | 8/2002 | Chan |
| 6,441,436 | B1 | 8/2002 | Wu et al. |
| 6,466,511 | B2 | 10/2002 | Fujita et al. |
| 6,479,862 | B1 | 11/2002 | King et al. |
| 6,480,407 | B1 | 11/2002 | Keeth |
| 6,492,211 | B1 | 12/2002 | Divakaruni et al. |
| 6,518,105 | B1 | 2/2003 | Yang et al. |
| 6,531,754 | B1 | 3/2003 | Nagano et al. |
| 6,537,871 | B2 | 3/2003 | Forbes et al. |
| 6,538,916 | B2 | 3/2003 | Ohsawa |
| 6,544,837 | B1 | 4/2003 | Divakauni et al. |
| 6,548,848 | B2 | 4/2003 | Horiguchi et al. |
| 6,549,450 | B1 | 4/2003 | Hsu et al. |
| 6,552,398 | B2 | 4/2003 | Hsu et al. |
| 6,552,932 | B1 | 4/2003 | Cernea |
| 6,556,477 | B2 | 4/2003 | Hsu et al. |
| 6,560,142 | B1 | 5/2003 | Ando |
| 6,563,733 | B2 | 5/2003 | Liu et al. |
| 6,566,177 | B1 | 5/2003 | Radens et al. |
| 6,567,330 | B2 | 5/2003 | Fujita et al. |
| 6,573,566 | B2 * | 6/2003 | Ker et al. ............... 257/355 |
| 6,574,135 | B1 | 6/2003 | Komatsuzaki |
| 6,590,258 | B2 | 7/2003 | Divakauni et al. |
| 6,590,259 | B2 | 7/2003 | Adkisson et al. |
| 6,617,651 | B2 | 9/2003 | Ohsawa |
| 6,621,725 | B2 | 9/2003 | Ohsawa |
| 6,632,723 | B2 | 10/2003 | Watanabe et al. |
| 6,650,565 | B1 | 11/2003 | Ohsawa |
| 6,653,175 | B1 | 11/2003 | Nemati et al. |
| 6,686,624 | B2 | 2/2004 | Hsu |
| 6,703,673 | B2 | 3/2004 | Houston |
| 6,707,118 | B2 | 3/2004 | Muljono et al. |
| 6,714,436 | B1 | 3/2004 | Burnett et al. |
| 6,721,222 | B2 | 4/2004 | Somasekhar et al. |
| 6,825,524 | B1 | 11/2004 | Ikehashi et al. |
| 6,861,689 | B2 | 3/2005 | Burnett |
| 6,870,225 | B2 | 3/2005 | Bryant et al. |
| 6,882,566 | B2 | 4/2005 | Nejad et al. |
| 6,888,770 | B2 | 5/2005 | Ikehashi |
| 6,894,913 | B2 | 5/2005 | Yamauchi |
| 6,897,098 | B2 | 5/2005 | Hareland et al. |
| 6,903,984 | B1 | 6/2005 | Tang et al. |
| 6,909,151 | B2 | 6/2005 | Hareland et al. |
| 6,912,150 | B2 | 6/2005 | Portman et al. |
| 6,913,964 | B2 | 7/2005 | Hsu |
| 6,936,508 | B2 | 8/2005 | Visokay et al. |
| 6,969,662 | B2 | 11/2005 | Fazan et al. |
| 6,975,536 | B2 | 12/2005 | Maayan et al. |
| 6,982,902 | B2 | 1/2006 | Gogl et al. |
| 6,987,041 | B2 | 1/2006 | Ohkawa |
| 7,030,436 | B2 | 4/2006 | Forbes |
| 7,037,790 | B2 | 5/2006 | Chang et al. |

(56) References Cited

U.S. PATENT DOCUMENTS

| | | |
|---|---|---|
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,217,978 B2 | 5/2007 | Joshi et al. |
| 7,230,846 B2 | 6/2007 | Keshavarzi et al. |
| 7,233,024 B2 | 6/2007 | Scheuerlein et al. |
| 7,256,459 B2 | 8/2007 | Shino |
| 7,265,419 B2 | 9/2007 | Minami et al. |
| 7,301,803 B2 | 11/2007 | Okhonin et al. |
| 7,301,838 B2 | 11/2007 | Waller et al. |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1* | 3/2003 | Matsumoto et al. ......... 257/347 |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0113959 A1 | 6/2003 | Min et al. |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee et al. |
| 2004/0029335 A1 | 2/2004 | Lee et al. |
| 2004/0075143 A1 | 4/2004 | Bae et al. |
| 2004/0108532 A1 | 6/2004 | Forbes |
| 2004/0188714 A1 | 9/2004 | Scheuerlein et al. |
| 2004/0217420 A1 | 11/2004 | Yeo et al. |
| 2004/0227189 A1 | 11/2004 | Kajiyama |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0040462 A1 | 2/2005 | Koh et al. |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0077564 A1 | 4/2005 | Forbes et al. |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0156156 A1 | 7/2005 | Tseng et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2005/0269642 A1 | 12/2005 | Minami |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0138558 A1 | 6/2006 | Morikado et al. |
| 2006/0157788 A1 | 7/2006 | Joshi et al. |
| 2006/0170050 A1 | 8/2006 | Forbes et al. |
| 2006/0223302 A1 | 10/2006 | Chang et al. |
| 2007/0001162 A1 | 1/2007 | Orlowski et al. |
| 2007/0008811 A1 | 1/2007 | Keeth et al. |
| 2007/0013007 A1 | 1/2007 | Kusunoki et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252204 A1 | 11/2007 | Wei et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Deml et al. |
| 2008/0165577 A1 | 7/2008 | Fazan et al. |
| 2008/0185648 A1 | 8/2008 | Jeong et al. |
| 2008/0253179 A1 | 10/2008 | Slesazeck |
| 2008/0258206 A1 | 10/2008 | Hofmann |
| 2008/0297236 A1 | 12/2008 | Ohsawa et al. |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |
| 2011/0221001 A1 | 9/2011 | Song et al. |
| 2011/0305085 A1 | 12/2011 | Widjaja et al. |

FOREIGN PATENT DOCUMENTS

| | | |
|---|---|---|
| EP | 175378 A2 | 3/1986 |
| EP | 202515 A1 | 11/1986 |
| EP | 207619 A1 | 1/1987 |
| EP | 245515 A1 | 11/1987 |
| EP | 253631 A2 | 1/1988 |
| EP | 300157 A2 | 1/1989 |

(56) References Cited

FOREIGN PATENT DOCUMENTS

| | | |
|---|---|---|
| EP | 333426 A2 | 9/1989 |
| EP | 350057 A1 | 1/1990 |
| EP | 354348 A2 | 2/1990 |
| EP | 359551 A2 | 3/1990 |
| EP | 362961 A1 | 4/1990 |
| EP | 366882 A2 | 5/1990 |
| EP | 465961 A1 | 1/1992 |
| EP | 510607 A1 | 10/1992 |
| EP | 513923 A2 | 11/1992 |
| EP | 537677 A2 | 4/1993 |
| EP | 564204 A2 | 10/1993 |
| EP | 579566 A2 | 1/1994 |
| EP | 599388 A1 | 6/1994 |
| EP | 599506 A1 | 6/1994 |
| EP | 601590 A2 | 6/1994 |
| EP | 606758 A1 | 7/1994 |
| EP | 642173 A1 | 3/1995 |
| EP | 682370 A1 | 11/1995 |
| EP | 689252 A1 | 12/1995 |
| EP | 694977 A2 | 1/1996 |
| EP | 725402 A2 | 8/1996 |
| EP | 726601 A1 | 8/1996 |
| EP | 727820 A1 | 8/1996 |
| EP | 727822 A2 | 8/1996 |
| EP | 731972 A1 | 9/1996 |
| EP | 739097 A2 | 10/1996 |
| EP | 744772 A1 | 11/1996 |
| EP | 788165 A2 | 8/1997 |
| EP | 801427 A2 | 10/1997 |
| EP | 836194 A2 | 4/1998 |
| EP | 844671 A1 | 5/1998 |
| EP | 858109 A2 | 8/1998 |
| EP | 860878 A2 | 8/1998 |
| EP | 869511 A2 | 10/1998 |
| EP | 878804 A2 | 11/1998 |
| EP | 920059 A2 | 6/1999 |
| EP | 924766 A2 | 6/1999 |
| EP | 933820 A1 | 8/1999 |
| EP | 951072 A1 | 10/1999 |
| EP | 971360 A1 | 1/2000 |
| EP | 980101 A2 | 2/2000 |
| EP | 993037 A2 | 4/2000 |
| EP | 1073121 A2 | 1/2001 |
| EP | 1162663 A2 | 12/2001 |
| EP | 1162744 A2 | 12/2001 |
| EP | 1179850 A2 | 2/2002 |
| EP | 1180799 A2 | 2/2002 |
| EP | 1191596 A2 | 3/2002 |
| EP | 1204146 A1 | 5/2002 |
| EP | 1204147 A1 | 5/2002 |
| EP | 1209747 A2 | 5/2002 |
| EP | 1233454 A2 | 8/2002 |
| EP | 1237193 A2 | 9/2002 |
| EP | 1241708 | 9/2002 |
| EP | 1241708 A2 | 9/2002 |
| EP | 1253634 A2 | 10/2002 |
| EP | 1280205 A2 | 1/2003 |
| EP | 1288955 A2 | 3/2003 |
| FR | 2197494 A5 | 3/1974 |
| GB | 1414228 A | 11/1975 |
| JP | S62-007149 | 1/1987 |
| JP | 62-272561 A | 11/1987 |
| JP | 02-294076 A | 12/1990 |
| JP | 03-171768 A | 7/1991 |
| JP | H04-176163 U | 6/1992 |
| JP | 05-347419 A | 12/1993 |
| JP | 08-213624 A | 8/1996 |
| JP | H08-213624 | 8/1996 |
| JP | 08-274277 A | 10/1996 |
| JP | H08-316337 | 11/1996 |
| JP | 09-046688 A | 2/1997 |
| JP | 09-082912 A | 3/1997 |
| JP | 10-242470 A | 9/1998 |
| JP | 11-087649 A | 3/1999 |
| JP | 12-247735 | 8/2000 |
| JP | 12-274221 A | 9/2000 |
| JP | 12-389106 A | 12/2000 |
| JP | 13-180633 A | 6/2001 |
| JP | 2002-009081 A | 1/2002 |
| JP | 2002-083945 A | 3/2002 |
| JP | 2002-094027 A | 3/2002 |
| JP | 2002-176154 A | 6/2002 |
| JP | 2002-246571 A | 8/2002 |
| JP | 2002-329795 A | 11/2002 |
| JP | 2002-343886 A | 11/2002 |
| JP | 2002-353080 A | 12/2002 |
| JP | 2003-031693 A | 1/2003 |
| JP | 2003-68877 | 3/2003 |
| JP | 2003-086712 A | 3/2003 |
| JP | 2003-100641 A | 4/2003 |
| JP | 2003-100900 A | 4/2003 |
| JP | 2003-132682 A | 5/2003 |
| JP | 2003-203967 A | 7/2003 |
| JP | 2003-243528 A | 8/2003 |
| JP | 2004-335553 A | 11/2004 |
| JP | 2006-525677 A | 11/2006 |
| WO | WO-01/24268 A1 | 4/2001 |
| WO | WO-2005/008778 A1 | 1/2005 |

OTHER PUBLICATIONS

Arimoto, A High-Density Scalable Twin Transistor RAM (TTRAM) With Verify Control for SOI Platform Memory IPs, Nov. 2007, IEEE J. Solid-State Circuits, vol. 22, No. 11, p. 2611-2619.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEMD, 1994, p. 809-812.

Assaderaghi et al., "A Dynamic Threshold Voltage MOSFET (DTMOS) for Very Low Voltage Operation", IEEE Electron Device Letters, vol. 15, No. 12, Dec. 1994, p. 510-512.

Assaderaghi et al., "A Novel Silicon-On-Insulator (SOI) MOSFET for Ultra Low Voltage Operation", 1994 IEEE Symposium on Low Power Electronics, p. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, p. 414-422.

Assaderaghi et al., "High-Field Transport of Inversion-Layer Electrons and Holes Including Velocity Overshoot", IEEE Transactions on Electron Devices, vol. 44, No. 4, Apr. 1997, p. 664-671.

Avci, Floating Body Cell (FBC) Memory for 16-nm Technology with Low Variation on Thin Silicon and 10-nm Box, Oct. 2008, SOI Conference, 2 pages.

Bae, Evaluation of 1T RAM using Various Operation Methods with SOONO (Silicon-On-ONO) device, Dec. 2008, IEDM, p. 805-808.

Ban et al., Integration of Back-Gate Doping for 15-nm Node Floating Body Cell (FBC) Memory, Components Research, Process Technology Modeling, presented in the 2010 VLSI Symposium on Jun. 17, 2010, 2 pages.

Ban, A Scaled Floating Body Cell (FBC) Memory with High-k+Metal Gate on Thin-Silicon and Thin-BOX for 16-nm Technology Node and Beyond, Jun. 2008, VLSI Symposium, p. 92-93.

Ban, Ibrahim, et al., "Floating Body Cell with Independently-Controlled Double Gates for High Density Memory," Electron Devices Meeting, 2006. IEDM '06. International, IEEE, p. 1-4, Dec. 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008, p. 795-798.

Blagojevic et al., Capacitorless 1T DRAM Sensing Scheme Automatice Reference Generation, IEEE J.Solid State Circuits, vol. 41, No. 6, pp. 1463-1470, 2006.

Blalock, T., "A High-Speed Clamped Bit-Line Current-Mode Sense Amplifier", IEEE Journal of Solid-State Circuits, vol. 26, No. 4, Apr. 1991, p. 542-548.

Butt, Scaling Limits of Double Gate and Surround Gate Z-RAM Cells, IEEE Trans. Elec. Dev., vol. 54, No. 9, p. 2255-2262, Sep. 2007.

(56) References Cited

OTHER PUBLICATIONS

Chan et al., "Effects of Floating Body on Double Polysilicon Partially Depleted SOI Nonvolatile Memory Cell", IEEE Electron Device Letters, vol. 24, No. 2, Feb. 2003, p. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009, p. 11.2.1-11.2.4.
Cho, A novel capacitor-less DRAM cell using Thin Capacitively-Coupled Thyristor (TCCT), 2005, IEDM, 4 pages.
Choi et al., Current Flow Mechanism in Schottky-Barrier MOSFET and Application to the 1T-DRAM, 2008, International Conference on SSDM, pp. 226-227.
Choi, High Speed Flash Memory and 1T-DRAM on Dopant Segregated Schottky Barrier (DSSB) FinFET SONOS Device for Multifunctional SoC Applications, Dec. 2008, IEDM, pp. 223-226.
Clarke, Junctionless Transistors Could Simply Chip Making, Say Researchers, EE Times, Feb. 2010, www.eetimes.com/showArticle.jhtml?articleID=223100050, 3 pages.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, IEEE EDL, vol. 30, No. 12, pp. 1377-1379, Dec. 2009.
Collaert, Comparison of scaled floating body RAM architectures, Oct. 2008, SOI Conference, 2 pages.
Ershov, Optimization of Substrate Doping for Back-Gate Control in SOI T-RAM Memory Technology, 2005, SOI Conference, pp. 1-2.
Ertosun et al., A Highly Scalable Capacitorless Double Gate Quantum Well Single Transistor DRAM: 1T-QW DRAM, 2008, IEEE EDL, pp. 1-3.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE, 14 pages.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, et al., Customizing SOI Floating Body Memory Architecture for System Performance and Lower Cost, 2006, SAME Forum, Lausanne, Switzerland, 3 pages.
Fisch, et al., Soft Error Performance of Z-RAM Floating Body Memory, 2006, SOI Conference, Lausanne, Switzerland, 2 pages.
Fisch, Z-RAM® Ultra-Dense Memory for 90nm and Below, 2006, Hot Chips, 35 pages.
Fossum et al., New Insights on Capacitorless Floating Body DRAM Cells, IEEE EDL, vol. 28, No. 6, pp. 513-516, Jun. 2007.
Fujita, Array Architecture of Floating Body Cell (FBC) with Quasi-Shielded Open Bit Line Scheme for sub-40nm Node, 2008, SOI Conference, 2 pages.
Furuhashi, et al., Scaling Scenario of Floating Body Cell (FBC) Suppressing $V_{th}$ Variation Due to Random Dopant Fluctuation, Dec. 2008, SOI Conference, 2 pages.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices, 4 pages.
Han et al., Bulk FinFET Unified-RAM (URAM) Cell for Multifunctioning NVM and Capacitorless 1T-DRAM, IEEE EDL, vol. 29, No. 6, pp. 632-634, Jun. 2008.
Han et al., Partially Depleted SONOS FinFET for Unified RAM (URAM) Unified Function for High-Speed 1T DRAM and Nonvolatile Memory, IEEE EDL, vol. 29, No. 7, pp. 781-783, Jul. 2008.
Han, Energy Band Engineered Unified-RAM (URAM) for Multi-Functioning 1T-DRAM and NVM, Dec. 2008, IEDM, pp. 227-230.
Han, Parasitic BJT Read Method for High-Performance Capacitorless 1T-DRAM Mode in Unified RAM, IEEE EDL, vol. 30, No. 10, pp. 1108-1110, Oct. 2009.
Hara, Y., "Toshiba's DRAM Cell Piggybacks on SOI Wafer", EE Times, Jun. 2003, 1 page.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
International Search Report mailed on Mar. 5, 2009 for International Application No. PCT/IB2008/00980 filed Jan. 24, 2008.
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI, 21 pages.
Jeong et al., "A Capacitor-less 1T DRAM Cell Based on a Surrounding Gate MOSFET with a Vertical Channel", Technology Development Team, Technology Development Team, Samsung Electronics Co., Ltd., pp. 92-93, May 2007.
Jeong et al., "A New Capacitorless 1T DRAM Cell: Surrounding Gate MOSFET with Vertical Channel (SGVC Cell)", IEEE Transactions on Nanotechnology, vol. 6, No. 3, May 2007, pp. 352-357.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-136.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub-100-nm Embedded and Stand-Alone Memory Applications, IEEE Trans. Elec.. Dev., vol. 50, No. 12, pp. 2408-2416, Dec. 2003.
Kwon et al., "A Highly Scalable $4F^2$ DRAM Cell Utilizing a Doubly Gated Vertical Channel", Extended Abstracts of the 2009 International Conference on Solid State Devices and Materials, UC Berkley, p. 142-143, Sendai (2009).
Lee et al., "A Novel Pattern Transfer Process for Bonded SOI Gigabit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.

(56) References Cited

OTHER PUBLICATIONS

Lin et al., "Opposite Side Floating Gate SOI Flash Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25, 10 pages.
Liu, Surface Recombination-Generation Processes of Gate, STI and Buried Oxide Interfaces, Responsible for Junction Leakage on SOI, ICSI, May 19, 2009, 2 pages.
Loncar et al., "One of Application of SOI Memory Cell—Memory Array", IEEE Proc. 22nd International Conference on Microelectronics (MIEL 2000), vol. 2, NIS, Serbia, May 14-17, 2000, pp. 455-458.
Lu et al., A Novel Two-Transistor Floating Body/Gate Cell for Low Power Nanoscale Embedded DRAM, Jun. 2008, IEEE Trans. Elec. Dev., vol. 55, No. 6, pp. 1511-1518.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005 Symposium on VLSI Circuits Digest of Technical Papers, pp. 358-361.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of $6F^2$ Single Cell Operation in Multi Gbit Memories Confirmed by a Newly Developed Method for Measuring Signal Sense Margin, 2007, IEEE, pp. 39-42.
Minami, A Floating Body Cell (FBC) fully Compatible with 90nm CMOS Technology(CMOS IV) for 128Mb SOI DRAM, 2005, IEDM Tech. Digest, pp. 317-320 (4 pages).
Mohapatra et al., Effect of Source/Drain Asymmetry on the Performance of Z-RAM® Devices, Oct. 2009, SOI conference, 2 pages.
Morishita, A Capacitorless Twin-Transistor Random Access Memory (TTRAM) on SOI, 2005, CICC, 4 pages.
Morishita, F. et al., "A Configurable Enhanced TTRAM Macro for System-Level Power Management Unified Memory", IEEE Journal of Solid-State Circuits, vol. 42, No. 4, pp. 853-861, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic Floating Body Control SOI CMOS Circuits for Power Managed Multimedia ULSIs", Proc. CICC, pp. 263-266, 1997.
Morishita, F., et al., "Leakage Mechanism due to Floating Body and Countermeasure on Dynamic Retention Mode of SOI-DRA,", Symposium on VLSI Technology Digest of Technical Papers, pp. 141-142, 1995.
Nagoga, Studying of Hot Carrier Effect in Floating Body Soi Mosfets by the Transient Charge Pumping Technique, Switzerland 2003, 2 pages.
Nayfeh, A Leakage Current Model for SOI based Floating Body Memory that Includes the Poole-Frenkel Effect, 2008, SOI Conference, 2 pages.
Nemati, A Novel High Density, Low Voltage SRAM Cell with a Vertical NDR Device, 1998, VLSI Tech. Symp., 2 pages.
Nemati, A Novel Thyristor-based SRAM Cell (T-RAM) for High-Speed, Low-Voltage, Giga-scale Memories, 1999, IEDM Conference, 4 pages.
Nemati, Embedded Volatile Memories-Embedded Tutorial: The New Memory Revolution, New Drives Circuits and Systems, ICCAD 2008, Nov. 2008, San Jose, CA, 23 pages.
Nemati, Fully Planar 0.562 µm² T-RAM Cell in a 130nm SOI CMOS Logic Technology for High-Density High-Performance SRAMs, 2004, IEDM, 4 pages.

Nemati, Thyristor RAM (T-RAM): A High-Speed High-Density Embedded Memory Technology for Nano-scale CMOS, 2007, Hot Chips Conference, Milpitas, CA, 24 pages.
Nemati, Thyristor-RAM: A Novel Embedded Memory Technology that Outperforms Embedded S RAM/DRAM, 2008, Linley Tech Tour, San Jose, CA, 11 pages.
Nishiguchi et al., Long Retention of Gain-Cell Dynamic Random Access Memory with Undoped Memory Node, IEEE EDL, vol. 28, No. 1, pp. 48-50, Jan. 2007.
Oh, Floating Body DRAM Characteristics of Silicon-On-ONO (SOONO) Devices for System-on-Chip (SoC) Applications, 2007, Symposium on VLSI Technology Digest of Technical Papers, pp. 168-169.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006), 2 pages.
Ohsawa, Autonomous Refresh of Floating Body Cell (FBC), Dec. 2008, IEDM, pp. 801-804.
Ohsawa, Design of a 128-Mb SOI DRAM Using the Floating Body Cell (FBC), IEEE J. Solid-State Circuits, vol. 41, No. 1, Jan. 2006, pp. 135-145.
Ohsawa, et al., An 18.5ns 128Mb SOI DRAM with a Floating Body Cell, 2005, ISSCC, pp. 458-459 & 609 (3 pages).
Okhonin, A Capacitor-Less 1T-DRAM Cell, IEEE Electron Device Letters, vol. 23, No. 2, Feb. 2002, pp. 85-87.
Okhonin, A SOI Capacitor-less 1T-DRAM Concept, pp. 153-154, 2001, SOI Conference.
Okhonin, et al., Charge Pumping Effects in Partially Depleted SOI MOSFETs, 2003, SOI Conference, 2 pages.
Okhonin, et al., New characterization techniques for SOI and related devices, 2003, ECCTD, 1 page.
Okhonin, et al., New Generation of Z-RAM, 2007, IEDM, Lausanne, Switzerland, 3 pages.
Okhonin, et al., Transient Charge Pumping for Partially and Fully Depleted SOI MOSFETs, 2002, SOI Conference, 2 pages.
Okhonin, et al., Ultra-scaled Z-RAM cell, 2008, SOI Conference, 2 pages.
Okhonin, Principles of Transient Charge Pumping on Partially Depleted SOI MOSFETs, May 2002, IEEE Electron Device Letters, vol. 23, No. 5, pp. 279-281.
Okhonin, Transient effects in PD SOI MOSFETs and potential DRAM applications, 2002, Solid-State Electronics, vol. 46, pp. 1709-1713.
Okhonin, Z-RAM® (Limits of DRAM), 2009, ESSDERC, Lausanne, Switzerland, 64 pages.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008, pp. 171-174.
Park, Fully Depleted Double-Gate 1T-DRAM Cell with NVM Function for High Performance and High Density Embedded DRAM, 2009, IMW, pp. 32-33.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using Gate-Induced Drain-Leakage (GIDL) Current for High Speed and Low Power applications, 2008, pp. 224-225, SSDM.

(56) References Cited

OTHER PUBLICATIONS

Puget et al., Quantum effects influence on thin silicon film capacitorless DRAM performance, 2006, SOI Conference, 2 pages.
Puget, FDSOI Floating Body Cell eDRAM Using Gate-Induced Drain-Leakage (GIDL) Write Current for High Speed and Low Power Applications, 2009, IMW, pp. 28-29.
Ranica et al., 1T-Bulk DRAM cell with improved performances: the way to scaling, 2005, ICMTD, 4 pages.
Ranica, A One Transistor Cell on Bulk Substrate (1T-Bulk) for Low-Cost and High Density eDRAM, 2004, Symposium on VLSI Technology Digest of Technical Papers, pp. 128-129 (2 pages).
Ranica, et al., A capacitor-less DRAM cell on 75nm gate length, 16nm thin Fully Depleted SOI device for high density embedded memories, 2004, IEDM, 4 pages.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM: Novel Capacitor-less DRAM Memory, SOI Conference, 2009 IEEE International, Oct. 5-8, 2009 pp. 1-2.
Roy, et al., Thyristor-Based Volatile Memory in Nano-Scale CMOS, 2006, ISSCC, 10 pages.
Sailing et al., Reliability of Thyristor Based Memory Cells, 2009, IRPS, 7 pages.
Sasaki et al., Charge Pumping in SOS-MOS Transistors, IEEE Trans. Elec. Dev., vol. ED-28, No. 1, Jan. 1981, pp. 48-52.
Sasaki et al., Charge Pumping SOS-MOS Transistor Memory, 1978, IEDM, pp. 356-359 (4 pages and clear graph of Fig. 10).
Schloesser et al., "A 6F$^2$ Buried Wordline DRAM Cell for 40nm and Beyond", IEEE, Qimonda Dresden GmbH & Co., pp. 809-812 (2008).
Shino et al., Floating Body RAM Technology and its Scalability to 32nm Node and Beyond, 2006, IEDM, 4 pages.
Shino et al., Operation Voltage Dependence of Memory Cell Characteristics in Fully Depleted Floating Body Cell, IEEE Trans. Elec. Dev., vol. 25, No. 10, Oct. 2005, pp. 2220-2226.
Shino, et al. Highly Scalable FBC (Floating Body Cell) with 25nm BOX Structure for Embedded DRAM Applications, 2004, Symposium on VLSI Technology, pp. 132-133 (2 pages).
Shino, et al., Fully-Depleted FBC (Floating Body Cell) with Enlarged Signal Window and Excellent Logic Process Compatibility, 2004, IEDM, 4 pages.
Sim et al., "Source-Bias Dependent Charge Accumulation in P+ -Poly Gate SOI Dynamic Random Access Memory Cell Transistors", Jpn. J. Appl. Phys. vol. 37 (1998) pp. 1260-1263, Part 1, No. 3B, Mar. 1998.
Singh, et al., A 2ns-Read-Latency 4Mb Embedded Floating-Body Memory Macro in 45nm SOI Technology, Feb. 2009, ISSCC, 3 pages.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, et al., 55 nm Capacitor-less 1T DRAM Cell Transistor with Non-Overlap Structure, Dec. 2008, IEDM, pp. 797-800.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.
Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.
Tanaka et al., "Scalability Study on a Capacitorless 1T-DRAM: From Single-gate PD-SOI to Double-gate FINDRAM", 2004 IEEE, 4 pages.
Tang, et al., Highly Scalable Capacitorless DRAM Cell on Thin-Body with Band-gap Engineered Source and Drain, Extended Abstracts of the 2009 ICSSDM, Sendai, 2009, pp. 144-145.
Terauchi et al., "Analysis of Floating-Body-Induced Leakage Current in 0.15 µm SOI DRAM", Proceedings 1996 IEEE International SOI Conference, Oct. 1996, pp. 138-139.
Thomas et al., "An SOI 4 Transistors Self-Refresh Ultra-Low-Voltage Memory Cell", IEEE, Mar. 2003, pp. 401-404.
Tomishima, et al., "A Long Data Retention SOI DRAM with the Body Refresh Function", IEICE Trans. Electron., vol. E80-C, No. 7, Jul. 1997, pp. 899-904.
Tsaur et al., "Fully Isolated Lateral Bipolar-MOS Transistors Fabricated in Zone-Melting-Recrystallized Si Films on SiO$_2$", IEEE Electron Device Letters, vol. EDL-4, No. 8, Aug. 1983, pp. 269-271.
Tu, et al., "Simulation of Floating Body Effect in SOI Circuits Using BSIM3SOI", Proceedings of Technical Papers (IEEE Cat No. 97TH8303), Jun. 1997, pp. 339-342.
Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (2 pages).
Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).
Villaret et al., Further Insight into the Physics and Modeling of Floating Body Capacitorless DRAMs, IEEE Trans. Elec. Dev., vol. 52, No. 11, Nov. 2005, pp. 2447-2454.
Wang et al., A Novel 4.5F$^2$ Capacitorless Semiconductor Memory Device, 2008, IEEE EDL, pp. 1-2.
Wann et al., "A Capacitorless DRAM Cell on SOI Substrate", IEEE IEDM, 1993, pp. 635-638.
Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.
Wei, A., "Measurement of Transient Effects in SOI DRAM/SRAM Access Transistors", IEEE Electron Device Letters, vol. 17, No. 5, May 1996, pp. 193-195.
Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.
Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.
Yamanaka et al., "Advanced TFT SRAM Cell Technology Using a Phase-Shift Lithography", IEEE Transactions on Electron Devices, vol. 42, No. 7, Jul. 1995, pp. 1305-1313.
Yamauchi et al., "High-Performance Embedded SOI DRAM Architecture for the Low-Power Supply", IEEE Journal of Solid-State Circuits, vol. 35, No. 8, Aug. 2000, pp. 1169-1178.
Yamawaki, M., "Embedded DRAM Process Technology", Proceedings of the Symposium on Semiconductors and Integrated Circuits Technology, 1998, vol. 55, pp. 38-43.

(56) References Cited

OTHER PUBLICATIONS

Yang, et al., Optimization of Nanoscale Thyristors on SOI for High-Performance High-Density Memories, 2006, SOI Conference, 2 pages.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using Gate-Induced Drain-Leakage (GIDL) Current for Low Power and High Speed Embedded Memory, IEEE Trans. Elec. Dev., vol. 53, No. 4, Apr. 2006, pp. 692-697.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in Silicon-On-ONO (SOONO) Device for the Capacitor-less RAM Applications, 2007, SOI Conference, 2 pages.

Zhou, Physical Insights on BJT-Based 1T DRAM Cells, IEEE Electron Device Letters, vol. 30, No. 5, May 2009, pp. 565-567.

* cited by examiner

SEMICONDUCTOR DEVICE WITH ELECTRICALLY FLOATING BODY

CROSS-REFERENCE TO RELATED APPLICATIONS

This patent application is a continuation of U.S. patent application Ser. No. 13/547,717, filed Jul. 12, 2012, which is a divisional of U.S. patent application Ser. No. 12/019,320, filed Jan. 24, 2008, now U.S. Pat. No. 8,264,041, issued Sep. 11, 2012, which claims the benefit of U.S. Provisional Patent Application No. 60/897,686, filed Jan. 26, 2007, each of which is hereby incorporated by reference herein in its entirety.

This application is related to U.S. patent application Ser. No. 11/509,188, filed Aug. 24, 2006, now U.S. Pat. No. 7,606,066, issued Oct. 20, 2009, which is the parent of U.S. patent application Ser. No. 12/573,203, filed Oct. 5, 2009.

TECHNICAL FIELD

The inventions relate to a semiconductor device, architecture, memory cell, array, and techniques for controlling and/or operating such device, cell, and array. More particularly, in one aspect, the inventions relate to a dynamic random access memory ("DRAM") cell, array, architecture and device, wherein the memory cell includes an electrically floating body configured or operated to store an electrical charge.

BACKGROUND

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD), fully depleted (FD) devices, multiple gate devices (for example, double or triple gate), and Fin-FET.

One type of dynamic random access memory cell is based on, among other things, the electrically floating body effect of SOI transistors; see, for example, U.S. Pat. No. 6,969,662 (the "'662 patent). In this regard, the dynamic random access memory cell may consist of a PD or a FD SOI transistor (or transistor formed in bulk material/substrate) on having a channel, which is disposed adjacent to the body and separated from the channel by a gate dielectric. The body region of the transistor is electrically floating in view of the insulation layer (or non-conductive region, for example, in a bulk-type material/substrate) disposed beneath the body region. The state of the memory cell is determined by the concentration of charge within the body region of the SOI transistor.

With reference to FIGS. 1A, 1B and 1C, in one embodiment, semiconductor DRAM array 10 includes a plurality of memory cells 12 each including transistor 14 having gate 16, body region 18, which is configured to be electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the '662 patent, including, for example, the features, attributes, architectures, configurations, materials, techniques and advantages described and illustrated therein, are incorporated by reference herein.

Referring to the N-channel transistor in FIGS. 2A and 2B, for example, the memory cell 12 of DRAM array 10 operates by accumulating in or emitting/ejecting majority carriers (electrons or holes) 34 from body region 18. In this regard, conventional write techniques may accumulate majority carriers (in this example, "holes") 34 in body region 18 of memory cells 12 by, for example, impact ionization near source region 20 and/or drain region 22. (See, FIG. 2A). The majority carriers 34 may be emitted or ejected from body region 18 by, for example, forward biasing the source/body junction and/or the drain/body junction. (See, FIG. 2B).

Notably, for at least the purposes of this discussion, logic high or logic "1" corresponds to, for example, an increased concentration of majority carries in the body region relative to an un-programmed device and/or a device that is programmed with logic low or logic "0". In contrast, logic low or logic "0" corresponds to, for example, a reduced concentration of majority carries in the body region relative to an un-programmed device and/or a device that is programmed with logic high or logic "1".

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines 28 to enable the reading of the memory cells associated with such word lines. The amount of drain current is determined or affected by the charge stored in the electrically floating body region of the transistor. As such, conventional reading techniques sense the amount of the channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

In sum, conventional writing programming techniques for memory cells having an N-channel type transistor often provide an excess of majority carriers by channel impact ionization (see, FIG. 3A) or by band-to-band tunneling (gate-induced drain leakage ("GIDL")) (see, FIG. 3B). The majority carrier may be removed via drain side hole removal (see, FIG. 4A), source side hole removal (see, FIG. 4B), or drain and source hole removal, for example, using the back gate pulsing (see, FIG. 4C).

Notably, conventional programming/reading techniques often lead to relatively large power consumption (due to, for example, high writing "0" current) and relatively small memory programming window. The present inventions, in one aspect, are directed to a combination of the programming/reading methods which allows relatively low power memory programming and provides a relatively larger memory programming window (e.g., both relative to at least the conventional programming techniques). This new approach may also provide a floating body memory cell that may provide better power consumption and may include improved retention characteristics.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

DETAILED DESCRIPTION

There are many inventions described herein as well as many aspects and embodiments of those inventions. In one aspect, the present inventions are directed to a semiconductor device including an electrically floating body. In another aspect, the present inventions are directed to techniques to control and/or operate a semiconductor memory cell (and memory cell array having a plurality of such memory cells as well as an integrated circuit device including a memory cell array) having one or more electrically floating body transistors in which an electrical charge is stored in the body region of the electrically floating body transistor. The techniques of the present inventions may employ intrinsic bipolar transistor currents (referred to herein as "source" currents) to control, write and/or read a data state in such a memory cell. In this regard, the present inventions may employ the intrinsic source current to control, write and/or read a data state in/of the electrically floating body transistor of the memory cell.

The present inventions are also directed to semiconductor memory cell, array, circuitry and device to implement such control and operation techniques. Notably, the memory cell and/or memory cell array may comprise a portion of an integrated circuit device, for example, logic device (such as, a microcontroller or microprocessor) or a portion of a memory device (such as, a discrete memory).

Figure 6:
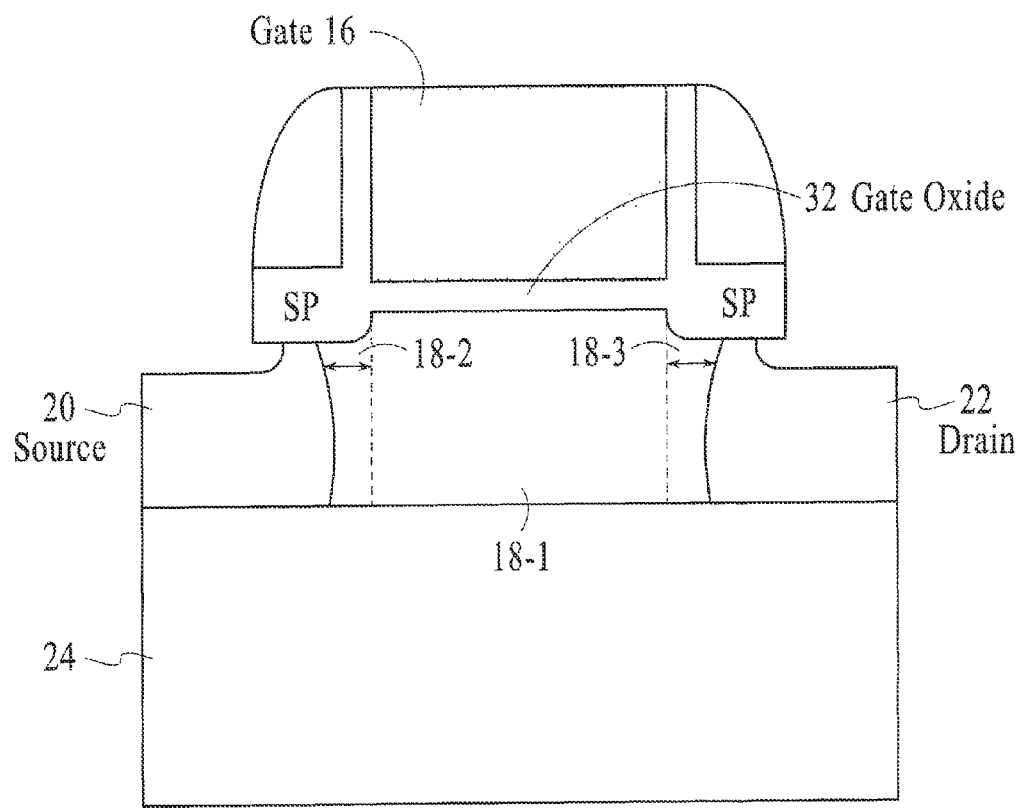
FIG. 6 shows an electrically floating body transistor, under an embodiment.

FIG. 6 shows an electrically floating body transistor 14, under an embodiment. The transistor 14 includes a body region 18 configured to be electrically floating. The body region 18 includes three portions or regions 18-1/18-2/18-3 that collectively define the electrically floating body 18. Each of the three portions 18-1/18-2/18-3 comprises the same or similar material (e.g., P-type in this example). The transistor 14 includes a gate 16 disposed over the first portion 18-1 of the body region 18. A gate dielectric 32 (e.g., gate oxide) is disposed between the gate 16 and the body region 18, and spacers SP are adjacent the gate dielectric 32.

A source region 20 adjoins a second portion 18-2 of the body region 18; the second portion 18-2 of the body region is adjacent the first portion 18-1 and separates the source region 20 from the first portion 18-1. A drain region 22 adjoins a third portion 18-3 of the body region 18; the third portion 18-3 of the body region is adjacent the first portion 18-1 and separates the drain region 22 from the first portion 18-1. The source region 20 and/or drain region 22 is created using conventional doping or implantation techniques but is not so limited. The second portion 18-2 and third portion 18-3 of the body region function to electrically "disconnect" (e.g., disconnect any charge that may accumulate, disconnect any inversion channel that may form) in the first portion 18-1 from one or more of the source 20 and the drain 22 as described in detail below.

An inversion channel is generated in the body region of conventional MOSFET devices in response to the application of control signals to the MOFSET. Once formed the inversion channel provides a continuous electrical channel from the source region to the body region. The inversion channel of conventional devices spans the entire body region as a result of the source and drain regions being configured, relative to the gate, to each underlie the gate. In this manner, application of the appropriate gate voltage to a conventional device causes the inversion channel to form a continuous electrical channel from the source to the drain region.

In contrast to conventional MOSFET devices, however, the source 20 and/or drain 22 regions of an embodiment are configured so that no portion of the source 20 and/or drain 22 regions is positioned under the gate 16. Configuration of the source 20 and/or drain 22 regions of an embodiment includes configuration through control of the shape and/or size of the doped source 20 and/or doped drain 22 regions of the transistor. Because only the first portion 18-1 of the body region is under the gate 16, charge that may accumulate or an inversion channel that may form is found only in the first portion 18-1 when the appropriate control signal is applied to the gate 16. No charge is accumulated and no inversion channel is formed in the second portion 18-2 and/or third portion 18-3 because these portions do not underlie the gate 16. The second portion 18-2 and/or third portion 18-3 therefore cause accumulated charge if any (or inversion channel if formed) to be discontinuous with the source region 20 and/or drain region 22.

As a result of the application of gate voltage to transistor 14, charge builds up in the first portion 18-1 of the body region 18, but current does not flow in the body region 18 because of the absence of accumulated charge and/or a continuous inversion channel between the source and drain regions. The discontinuous configuration of the first portion 18-1 of the body region relative to the source and drain regions therefore acts as an "open circuit" relative to the flow of current between the source 20 and drain 22 regions. Any charge present in the body region 18 thus causes transistor 14 to behave like a capacitor because the region of charge in the body 18-1 is disconnected from the source 20 and/or drain 22 regions.

Figure 7A:
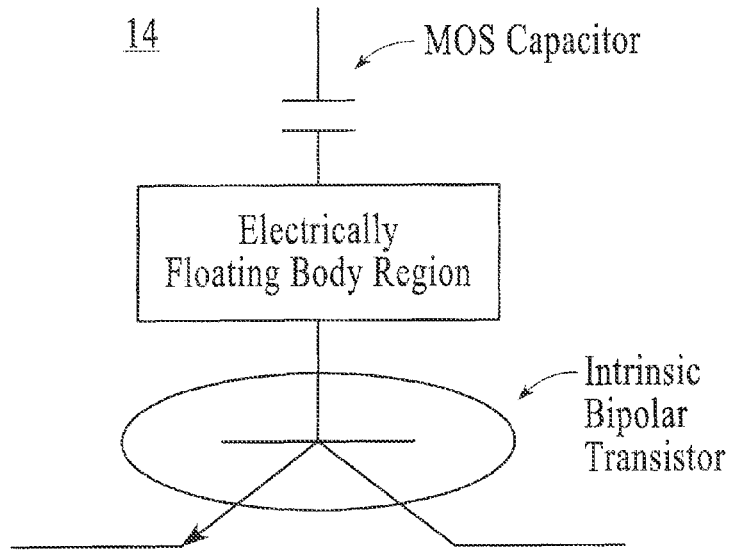
FIG. 7A shows electrically floating body transistor schematically illustrated as including a MOS capacitor "component" and an intrinsic bipolar transistor "component", under an embodiment.

FIG. 7A shows electrically floating body transistor 14 schematically illustrated as including a MOS capacitor "component" and an intrinsic bipolar transistor "component", under an embodiment. In one aspect, the present inventions employ the intrinsic bipolar transistor "component" to program/write as well as read memory cell 12. In this regard, the intrinsic bipolar transistor generates and/or produces a source or bipolar transistor current which is employed to program/write the data state in memory cell 12 and read the data state of memory cell 12. Notably, in this example embodiment, electrically floating body transistor 14 is an N-channel device. As such, majority carriers 34 are "holes".

The bipolar transistor 14 of an embodiment has a floating body, meaning the potential is not fixed or "floating". The potential for example depends on the charge at the gate. A conventional bipolar transistor requires each of base current, emitter current, and collector current for proper operation. Any base of the transistor 14 in this embodiment, however, is floating and not fixed because there is no base contact as found in conventional bipolar FETs; the current in this transistor is therefore referred to herein as a "source" current produced by impact ionization in the body region as described below.

Figure 7B:
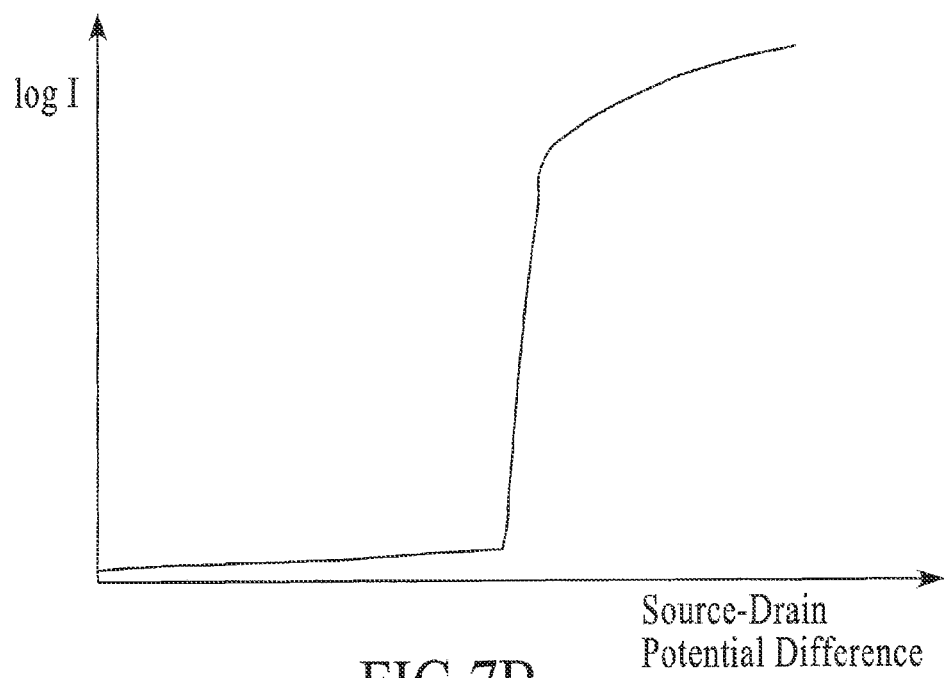
FIG. 7B is an example characteristic curve of electrically floating body transistor, under an embodiment.

FIG. 7B is an example characteristic curve of electrically floating body transistor 14, under an embodiment. The characteristic curve shows a significant increase in source current (e.g., "log I") at and above a specific threshold value of the potential difference between applied source voltage and applied drain voltage ("source-drain potential difference"). The reason for this is that a voltage differential at or above a certain threshold generates a high electric field in the body region. The high electric field results in impact ionization in the first portion 18-1 of the body region 18, a process during which electrons or particles with enough energy generate majority carriers i.e. holes. The impact ionization drives majority carriers to the body region, which increases the body potential, while any minority carriers flow to the drain (or source) region. The increased body potential results in an increase in source current in the body region; thus, the excess majority carriers of the body region generate source current of transistor 14 of an embodiment.

Figure 8A:
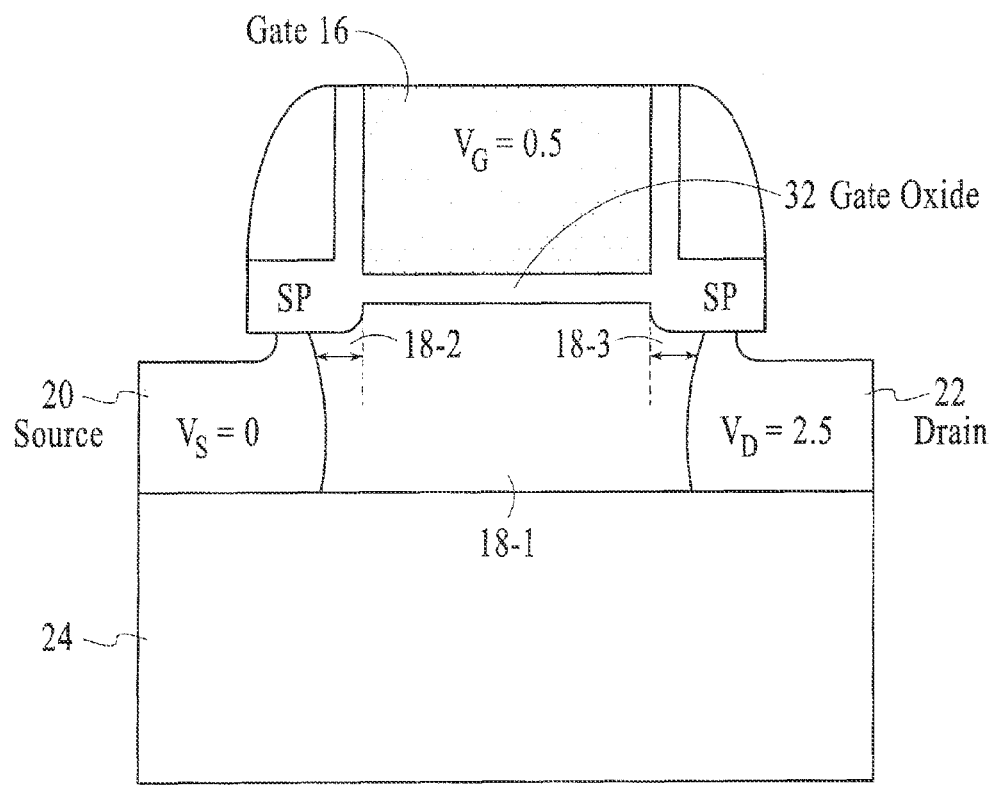
FIGS. 8A and 8B show various stages of operation of transistor when writing or programming logic "1", under an embodiment.
Figure 8B:
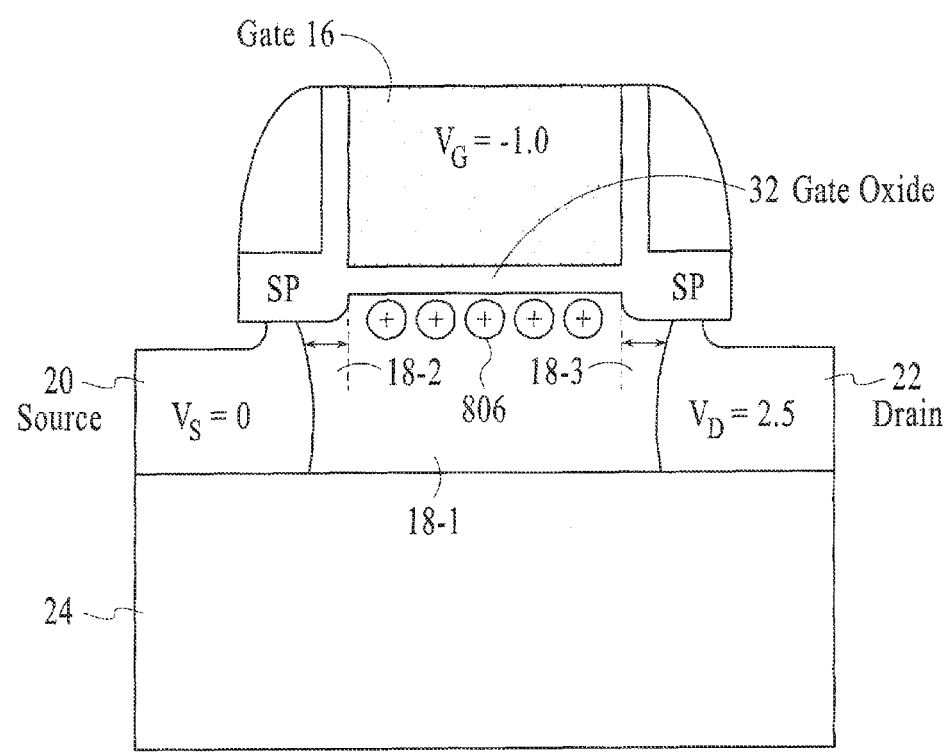

FIGS. 8A and 8B show operation of transistor 14 when writing or programming logic "1", under an embodiment. The transistor 14 of this embodiment is an N-channel or nMOS FET, but is not so limited; transistor 14 may be a P-channel or pMOS FET in an alternative embodiment. The N-channel device includes source 20 and drain 22 regions comprising N+-type material while the body region 18 comprises a P-type material.

A logic "1" programming operation of an embodiment includes a two stage control signal application during which the gate voltage is changed from a first voltage level to a second voltage level. In operation, when writing or programming logic "1", in one embodiment, control signals having predetermined voltages (for example, Vg=0.5 v, Vs=0 v, and Vd=2.5 v) are initially applied during stage one to gate 16, source region 20 and drain region 22 (respectively) of transistor 14 of memory cell 12 (FIG. 8A). The stage one control signals may result in an accumulation of minority carriers (not shown) in the electrically floating body 18. As a result of the polarity (e.g., positive) of the control signal applied to the gate with the stage one control signals, any minority carriers that happen to be present in the body region 18 accumulate in the first portion 18-1 of the body 18. The minority carriers may accumulate in an area of the first portion 18-1 under the gate, but are not so limited.

The physical behavior in the first portion 18-1 of the body 18 in response to the stage one control signals of an embodiment is in contrast to conventional transistor devices in which an inversion channel (also referred to as an "N-channel") forms under the gate in an area that is close to the interface between gate dielectric 32 and electrically floating body 18. The inversion channel is of the same type as the source and drain regions (e.g., N-type in an nMOS FET) and functions to electrically couple the source and drain regions.

The inversion channel, however, is not generally formed in the transistor 14 of an embodiment and, additionally, the accumulation of minority carriers in the first portion 18-1 of the body if any is discontinuous with the source 20 and/or drain 22 regions of the device. The reason that no inversion channel is formed in the transistor 14 is because, as the first portion 18-1 of the body 18 is electrically "disconnected" from the source 20 and drain 22 regions, the time required to create an inversion channel during a programming operation is quite long relative to a writing time for example. Therefore, considering an example writing time of an embodiment approximately in a range of 1-10 nanoseconds, and considering the time required for generation of an inversion channel in the "disconnected" first portion 18-1 of the body is much longer than 10 nanoseconds, an inversion channel is not generally created in the transistor 14 during typical programming operations. Similarly, relatively few or no minority carriers accumulate in the body region.

Furthermore, even if an inversion channel were to form in the first portion 18-1 of the body region as a result of the gate voltage, the inversion channel would not form in the second 18-2 and third 18-3 portions of the body region because these regions 18-2/18-3 are not under the gate. Therefore, any inversion channel formed under the embodiments described herein would be "disconnected" from or discontinuous with the source 20 and drain 22 regions.

The lack of an inversion channel or discontinuous inversion channel (if one were to form) of the transistor of an embodiment is in contrast to conventional transistors in which the inversion channel forms and spreads from the source to the drain and provides conductivity of the transistor. However, the configuration of these conventional devices is such that the gate overlays the entire body region between the source and drain regions, and the programming times are of a length that ensures formation of an inversion channel when appropriate voltages are applied, thereby creating a continuous inversion channel that "connects" the source and drain regions upon application of the appropriate polarity signal at the gate.

The stage one control signals also generate or provide a source current in electrically floating body region 18 of transistor 14. More specifically, the potential difference between the source voltage and the drain voltage (e.g., 2.5 volts) is greater than the threshold required to turn on the bipolar transistor. Therefore, source current of the transistor causes or produces impact ionization and/or the avalanche multiplication phenomenon among particles in the electrically floating body region 18. The impact ionization produces, provides, and/or generates an excess of majority carriers 806 (FIG. 8B) in the electrically floating body region 18 of transistor 14 of memory cell 12 as described above.

Notably, it is preferred that the source current responsible for impact ionization and/or avalanche multiplication in electrically floating body region 18 is initiated or induced by the control signal applied to gate 16 of transistor 14 along with the potential difference between the source 20 and drain 22 regions. Such a control signal may induce channel impact ionization which raises or increases the potential of body region 18 and "turns on", produces, causes and/or induces a source current in transistor 14. One advantage of the proposed writing/programming technique is that a large amount of the excess majority carriers 806 may be generated and stored in electrically floating body region 18 of transistor 14.

The stage two control signals are subsequently applied to the transistor when writing or programming logic "1" as described above. The stage two control signals are control signals having predetermined voltages (for example, Vg=−1.0 v, Vs=0 v, and Vd=2.5 v) applied to gate 16, source region 20 and drain region 22 (respectively) of transistor 14 of memory cell 12 (FIG. 8B) subsequent to stage one. As a result of the polarity (e.g., negative) of the control signal applied to the gate with the stage two control signals, the majority carriers 806 of the body region 18 accumulate near the surface of the first portion 18-1 of the body region (FIG. 8B). The polarity of the gate signal (e.g., negative) combined with the floating body causes the majority carriers 806 to become trapped or "stored" near the surface of the first portion 18-1 of the body region. In this manner the body region 18 of the transistor "stores" charge (e.g., equivalently, functions like a capacitor). Thus, in this embodiment, the predetermined voltages of the stage one and stage two control signals program or write logic "1" in memory cell 12 via impact ionization and/or avalanche multiplication in electrically floating body region 18.

Figure 9A:
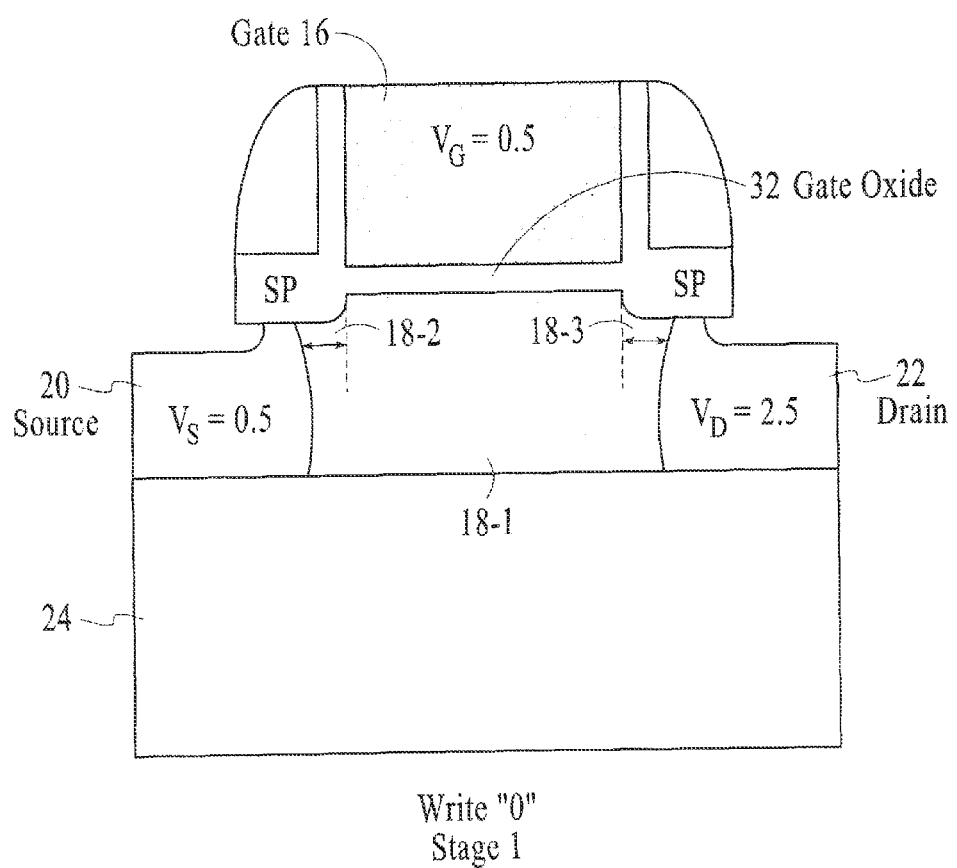
FIGS. 9A and 9B show various stages of operation of transistor when writing or programming logic "0", under an embodiment.
Figure 9B:
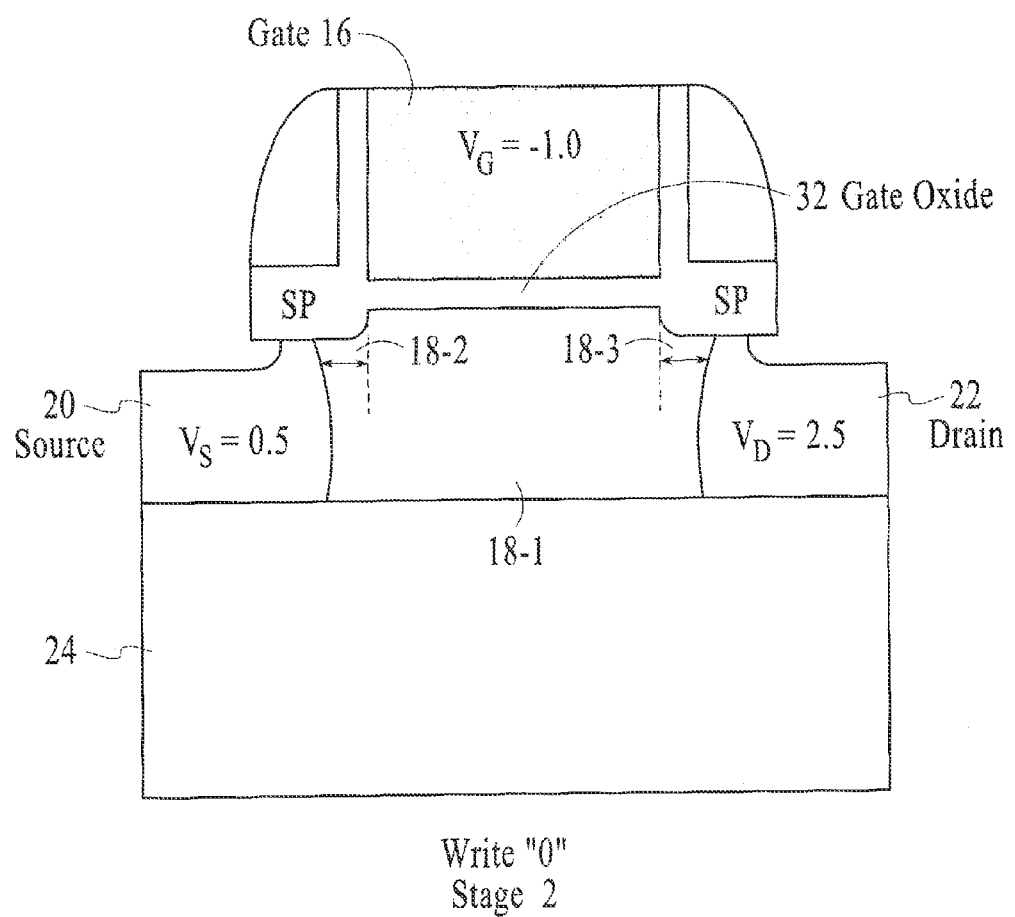

FIGS. 9A and 9B show operation of transistor 14 when writing or programming logic "0", under an embodiment. A logic "0" programming operation of an embodiment includes a two stage control signal application during which the gate voltage is changed from a first voltage level to a second voltage level. In operation, when writing or programming logic "0", in one embodiment, control signals having predetermined voltages (for example, Vg=0.5 v, Vs=0.5 v, and Vd=2.5 v) are initially applied during stage one to gate 16, source region 20 and drain region 22 (respectively) of transistor 14 of memory cell 12 (FIG. 9A). The stage one control signals may result in an accumulation of minority carriers (not shown) in the electrically floating body 18. More specifically, as a result of the polarity (e.g., positive) of the control signal applied to the gate with the stage one control signals, any accumulation of minority carriers occurs under the gate 16 in the first portion 18-1 of the body region, in an area that is close to the interface between gate dielectric 32 and electrically floating body 18 as described above. Any minority carriers that accumulate are in the first portion 18-1 of the body region as a result of the gate voltage, and thus do not accumulate in the second 18-2 and third 18-3 portions of the body region. Therefore, the accumulated charge of the body region 18 is discontinuous with the source 20 and drain 22 regions.

The potential difference between the source voltage and the drain voltage (e.g., 2.0 volts) of the stage one control signals, however, is less than the threshold required to turn on transistor 14. Consequently, no impact ionization takes place among particles in the body region 18 and no bipolar or source current is produced in the electrically floating body region 18. Thus, no excess of majority carriers are generated in the electrically floating body region 18 of transistor 14 of memory cell 12.

The stage two control signals are subsequently applied to the transistor 14 when writing or programming logic "0" as described above. The stage two control signals are control signals having predetermined voltages (for example, Vg=−1.0 v, Vs=0.5 v, and Vd=2.5 v) applied to gate 16, source region 20 and drain region 22 (respectively) of transistor 14 of memory cell 12 (FIG. 9B) subsequent to stage one. The polarity (e.g., negative) of the gate signal may result in any minority carriers that accumulate being removed from electrically floating body region 18 of transistor 14 via one or more of the source region 20 and the drain region 22. Furthermore, the polarity of the gate signal (e.g., negative) causes any minority carriers remaining in the body region 18 to be trapped or "stored" near the surface of the first portion of the body region 18. The result is an absence of excess majority carriers in the body region 18 so that, in this manner, the predetermined voltages of the stage one and stage two control signals program or write logic "0" in memory cell 12.

A logic "0" programming operation of an alternative embodiment includes a two stage control signal application during which the gate voltage is changed from a first voltage level to a second voltage level. In operation, when writing or programming logic "0", in this alternative embodiment, control signals having predetermined voltages (for example, Vg=0 v, Vs=0 v, and Vd=0 v) are initially applied during stage one to gate 16, source region 20 and drain region 22 (respectively) of transistor 14 of memory cell 12.

The voltage levels described here as control signals to implement the write operations are provided merely as examples, and the embodiments described herein are not limited to these voltage levels. The control signals increase the potential of electrically floating body region 18 which "turns on", produces, causes and/or induces a source current in the transistor of the memory cell. In the context of a write operation, the source current generates majority carriers in the electrically floating body region which are then stored. In the context of a read operation, the data state may be determined primarily by, sensed substantially using and/or based substantially on the source current that is responsive to the read control signals and significantly less by the interface channel current component, which is less significant and/or negligible relatively to the bipolar component.

Accordingly, the voltage levels to implement the write operations are merely examples of control signals. Indeed, the indicated voltage levels may be relative or absolute. Alternatively, the voltages indicated may be relative in that each voltage level, for example, may be increased or decreased by a given voltage amount (for example, each of the gate, source, and drain voltage may be increased or decreased by 0.5, 1.0 and 2.0 volts) whether one or more of the voltages (for example, the source, drain or gate voltages) become or are positive and negative.

In one embodiment, the memory cell 12 may be implemented in a memory cell array. When a memory cell is implemented in a memory cell array configuration, it may be advantageous to implement a "holding" operation or condition to certain memory cells when programming one or more other memory cells of the array in order to improve or enhance the retention characteristics of such certain memory cells. In this regard, the transistor of the memory cell may be placed in a "holding" state via application of control signals (having predetermined voltages) which are applied to the gate and the source and drain regions of the transistor of the memory cells which are not involved in the write or read operations.

Figure 10:
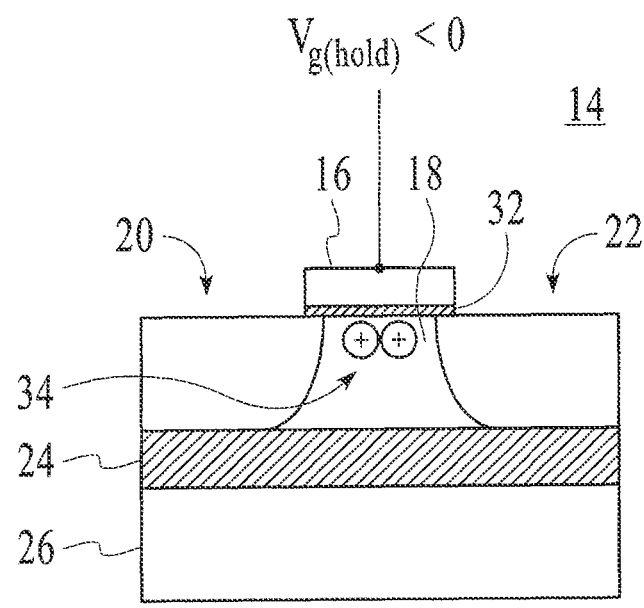
FIG. 10 shows an example schematic (and control signal) of an example embodiment of an aspect of the present inventions of holding or maintaining the data state of a memory cell when programming, for example, a neighboring memory cell to a predetermined data state (for example, logic state "1" and/or logic state "0")

For example, with reference to FIG. 10, such control signals provide, cause and/or induce majority carrier accumulation in an area that is close to the interface between gate dielectric 32 and electrically floating body 18. In this embodiment, it may be preferable to apply a negative voltage to gate 16 where transistor 14 is an N-channel type transistor 14. The proposed holding condition may provide enhanced retention characteristics.

Figure 11:
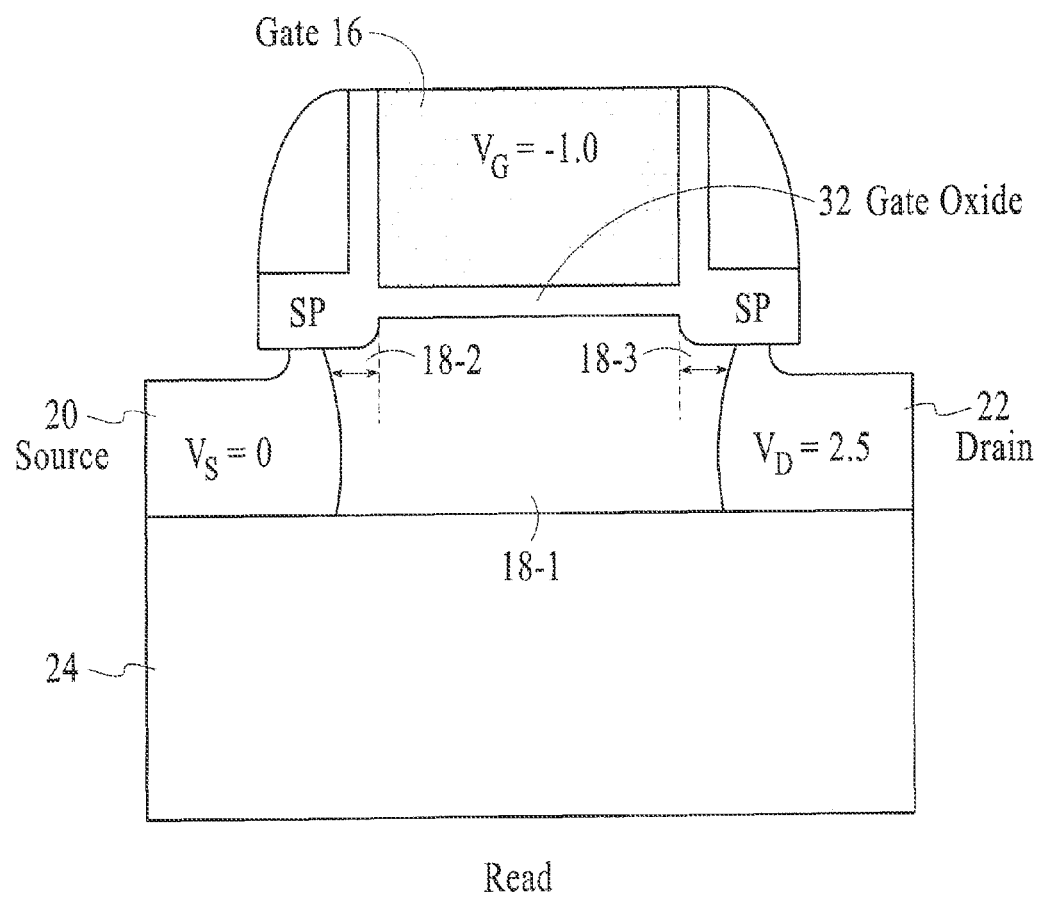
FIG. 11 is an example of an operation under which the data state of a memory cell may be read and/or determined by applying control signals having predetermined voltages to gate and source region and drain region of transistor, under an embodiment.

With reference to FIG. 11, in one embodiment, the data state of memory cell 12 may be read and/or determined by applying control signals having predetermined voltages to gate 16 and source region 20 and drain region 22 of transistor 14 (for example, Vg=−1.0 v, Vs=0 v and Vd=2.5 v, respectively). Such control signals, in combination, induce and/or cause a source current in memory cells 12 that are programmed to logic "1" as described above. As such, sensing circuitry (for example, a cross-coupled sense amplifier), which is coupled to transistor 14 (for example, drain region 22) of memory cell 12, senses the data state using primarily and/or based substantially on the source current. Notably, for those memory cells 12 that are programmed to logic "0", such control signals induce, cause and/or produce little to no source current (for example, a considerable, substantial or sufficiently measurable source current).

Thus, in response to read control signals, electrically floating body transistor 14 generates a source current which is representative of the data state of memory cell 12. Where the data state is logic high or logic "1", electrically floating body transistor 14 provides a substantially greater source current than where the data state is logic low or logic "0". Electrically floating body transistor 14 may provide little to no source current when the data state is logic low or logic "0". As discussed in more detail below, data sensing circuitry determines the data state of the memory cell based substantially on the source current induced, caused and/or produced in response to the read control signals.

The voltage levels described here as control signals to implement the read operations are provided merely as examples, and the embodiments described herein are not limited to these voltage levels. The indicated voltage levels may be relative or absolute. Alternatively, the voltages indicated may be relative in that each voltage level, for example, may be increased or decreased by a given voltage amount (for example, each voltage may be increased or decreased by 0.5, 1.0 and 2.0 volts) whether one or more of the voltages (for example, the source, drain or gate voltages) become or are positive and negative.

Figure 12:
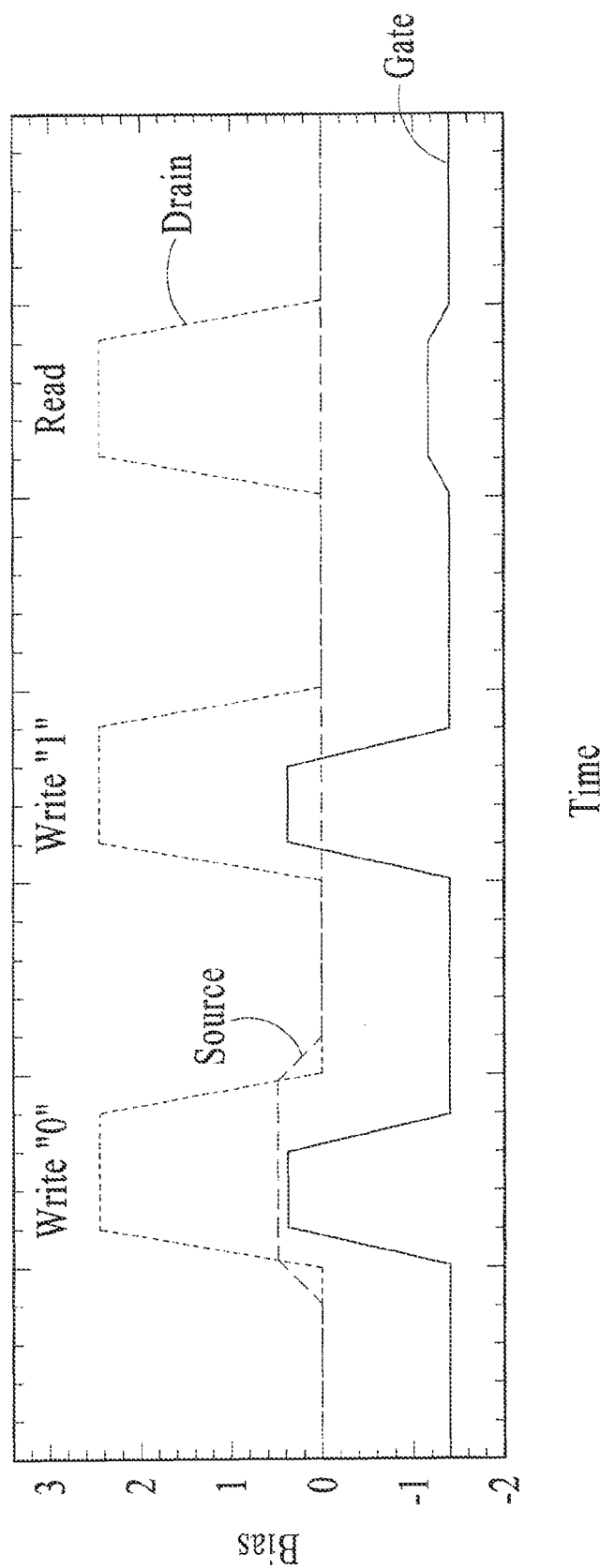
FIG. 12 is a plot of voltage levels versus time for examples of each of write "0", write "1", and read operations, under an embodiment.

FIG. 12 is a plot of voltage levels versus time for examples of each of write "0", write "1", and read operations, under an embodiment. These examples are described in detail above. The voltage levels for each of the source and drain are interchangeable as a result of the MOSFET being a symmetrical device; therefore, voltage levels shown or described herein as applied to the source can be applied to the drain, while voltage levels shown or described herein as applied to the drain can be applied to the source.

As described above with reference to FIG. 6, electrically floating body transistor 14 includes a body region 18 configured to be electrically floating. The body region 18 includes three portions or regions 18-1/18-2/18-3 that collectively define the electrically floating body 18. The transistor 14 includes a gate 16 disposed over the first portion 18-1 of the body region 18. A source region 20 adjoins a second portion 18-2 of the body region 18, and a drain region 22 adjoins a third portion 18-3 of the body region 18; the second portion 18-2 and third portion 18-3 of the body region 18 each adjoin the first portion 18-1. Consequently, the second portion 18-2 and third portion 18-3 of the body region function to "disconnect" any charge that may accumulate and/or any inversion channel that may form in the first portion 18-1 from one or more of the source 20 and the drain 22.

Figure 13:
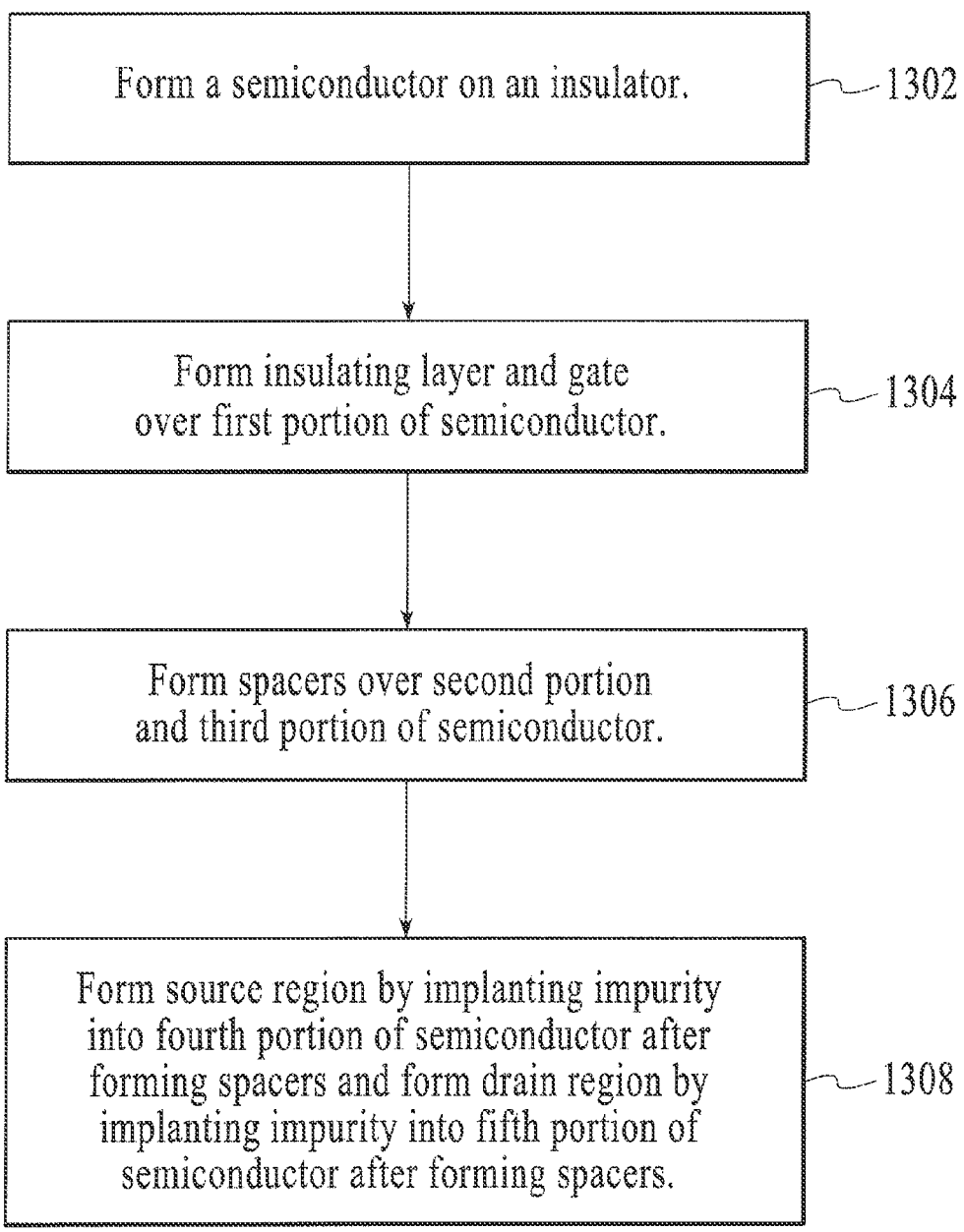
FIG. 13 is a flow diagram for forming a transistor, under an embodiment.

FIG. 13 is a flow diagram for forming transistor 14, under an embodiment. Transistor 14 is formed, generally, by forming 1302 a semiconductor on an insulator. An insulating layer and a gate is formed 1304 over a first portion of the semiconductor. Spacers are formed 1306 over a second portion and a third portion of the semiconductor, and the spacers adjoin the insulating layer. The first portion, second portion, and third portion of the semiconductor collectively form the floating body region. Formation of transistor 14 continues by forming 1308 a source region through implantation of an impurity into a fourth portion of the semiconductor after forming the spacers. The fourth portion of the semiconductor is adjacent the second portion. A drain region is also formed 1308 by implanting the impurity into a fifth portion of the semiconductor after forming the spacers. The fifth portion of the semiconductor is adjacent the third portion.

More specifically, in fabricating transistor 14, the gate is defined and used as a mask during implantation of the semiconductor to form the source and drain regions of the device. The spacers are then formed prior to any implantation or doping of the semiconductor so that all implantation of the semiconductor (e.g., implantation to form the source and drain) is performed after formation of the spacers. This is in contrast to conventional semiconductor processes in which a gate is formed, followed by a first implantation process (e.g., to form a lightly-doped portion of the source and drain regions), followed by formation of the spaces, and followed by a second implantation process (e.g., to form a highly-doped portion of the source and drain regions).

As a result of implanting only after formation of the spacers, the doping profiles that result in creation of the source and/or drain region are configured so that the body region includes the second 18-2 and/or third 18-3 portions and thus extends beyond an extended lateral boundary of the gate. The second 18-2 and/or third 18-3 portions of the body region function to prevent any inversion channel formation through the entire body region of the device because the area of the body region in which the channel forms under the gate is not continuous with the source and drain regions, as described above. Therefore, upon application of a gate voltage that is appropriate to material of the body region, charge accumulates in the body region of the device, but current cannot flow between the source and drain regions because no inversion channel is formed between the source and/or drain and any accumulated charge is disconnected from the source and/or drain.

The transistor devices of various alternative embodiments can provide a discontinuous region of any accumulated charge in the body by disconnecting the first portion of the body as described herein at the source region, the drain region, or both the source and drain regions. Further, various doping densities (e.g., very light, light, high, and very high doping) and/or profiles can be used in the source, body, and drain regions of the transistor 14. Examples follow of various alternative embodiments.

Figure 14:
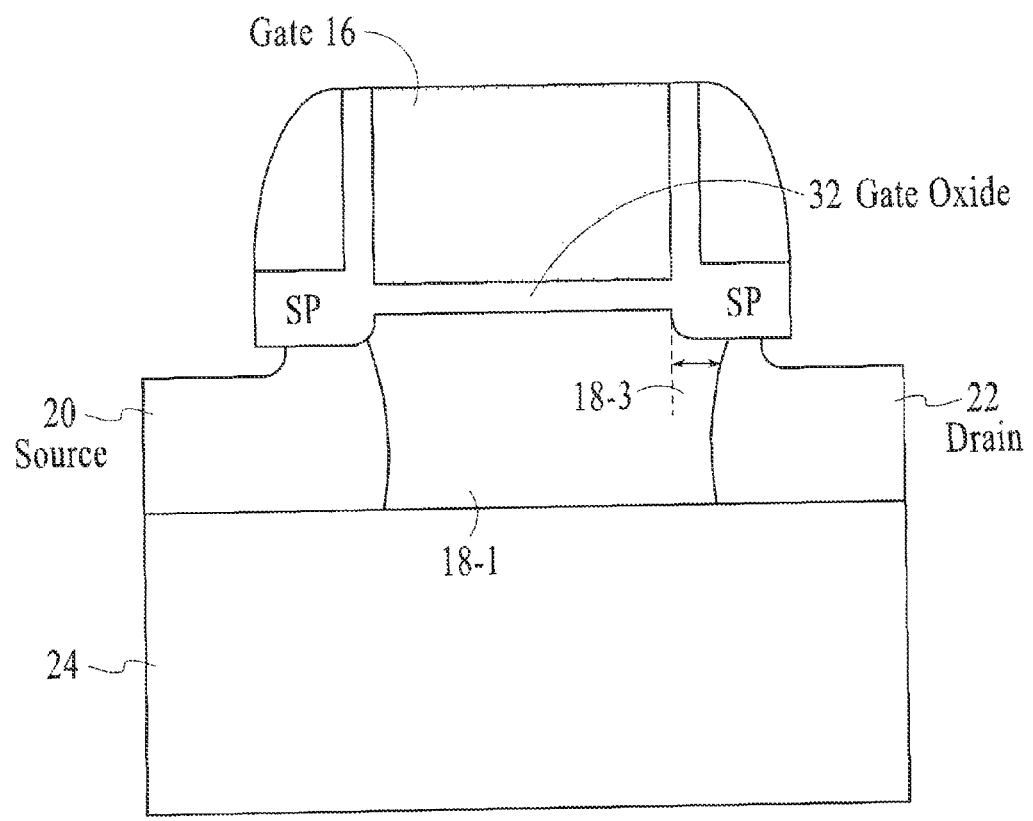
FIG. 14 shows an electrically floating body transistor in which the first portion of the body region is made discontinuous with only the drain by a third portion of the body region, under an embodiment.

FIG. 14 shows an electrically floating body transistor 14 in which the first portion 18-1 of the body region is made discontinuous with only the drain by a third portion 18-3 of the body region, under an embodiment.

Figure 15:
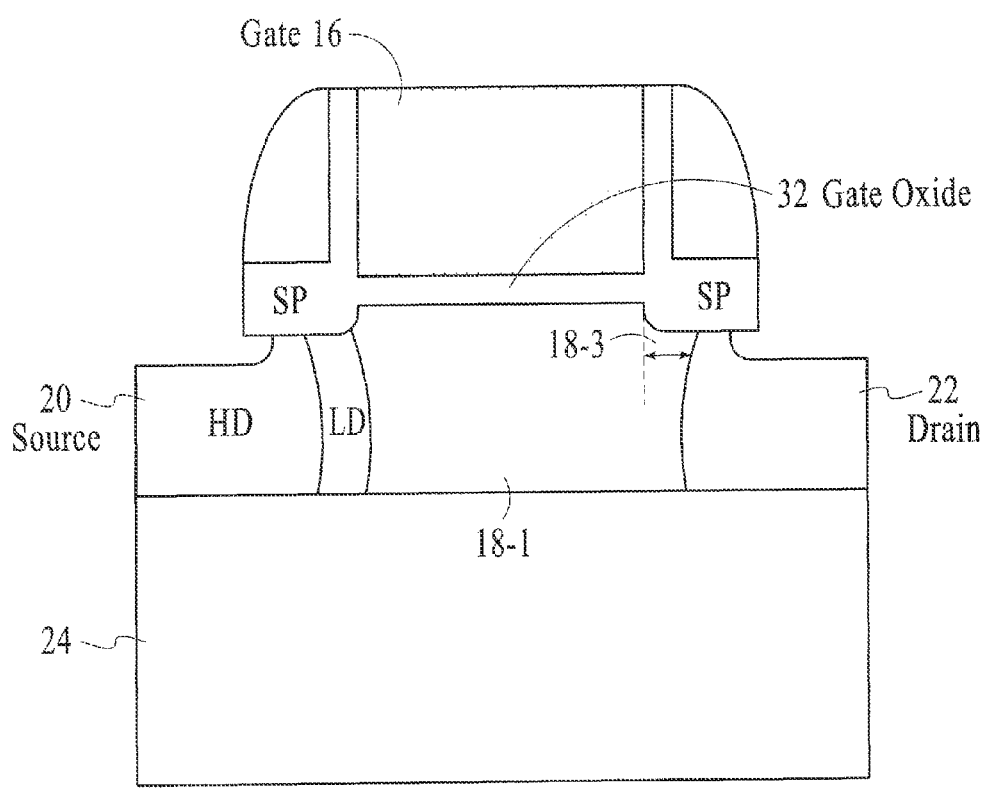
FIG. 15 shows an electrically floating body transistor in which the first portion of the body region is made discontinuous with only the drain by a third portion of the body region, under an embodiment; the source region includes a highly-doped (HD) portion and a lightly-doped (LD) portion.

FIG. 15 shows an electrically floating body transistor 14 in which the first portion 18-1 of the body region is made discontinuous with only the drain by a third portion 18-3 of the body region, under an embodiment. The source region includes a highly-doped (HD) portion and a lightly-doped (LD) portion.

Figure 16:
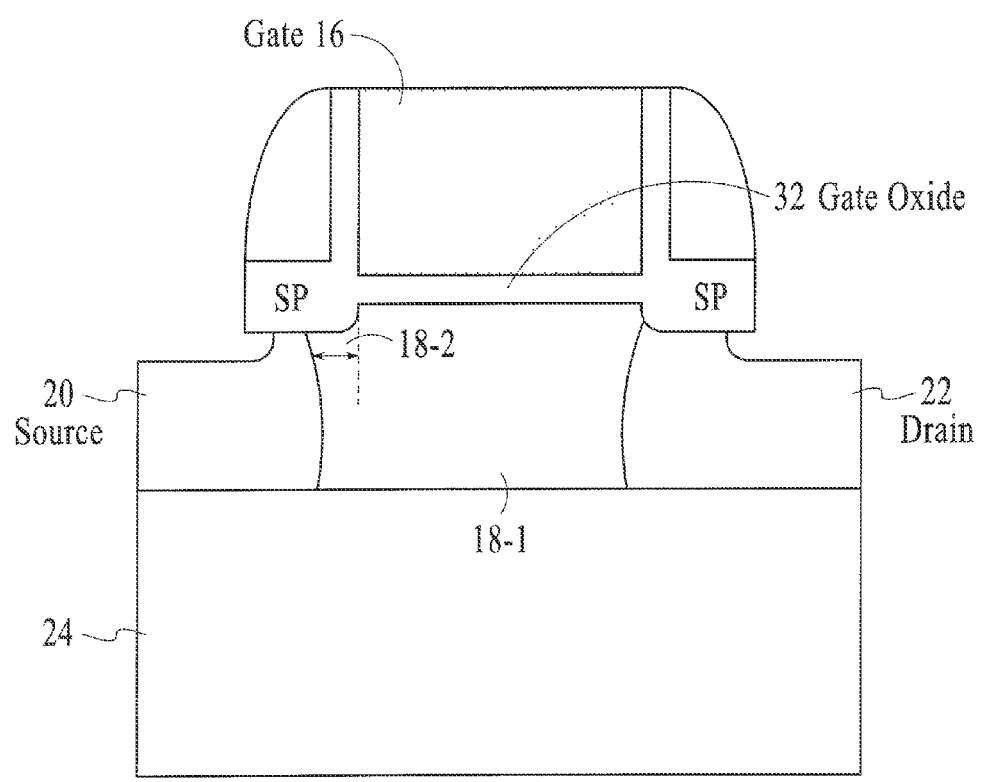
FIG. 16 shows an electrically floating body transistor in which the first portion of the body region is made discontinuous with only the source by a second portion of the body region, under an embodiment.

FIG. 16 shows an electrically floating body transistor 14 in which the first portion 18-1 of the body region is made discontinuous with only the source by a second portion 18-2 of the body region, under an embodiment.

Figure 17:
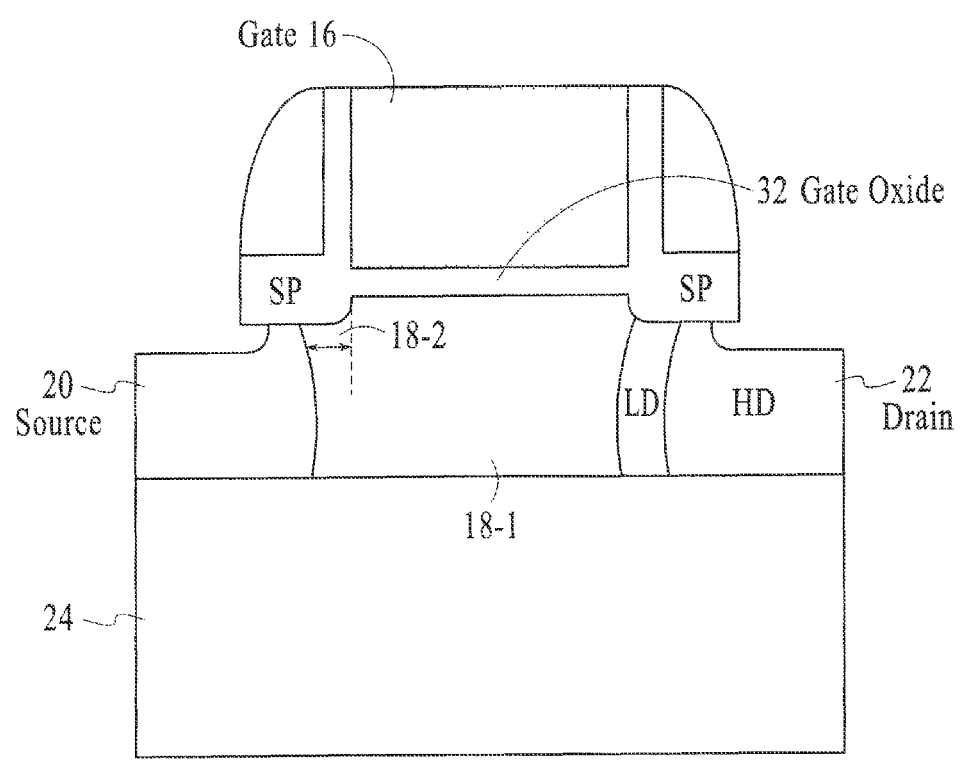
FIG. 17 shows an electrically floating body transistor in which the first portion of the body region is made discontinuous with the only the source by a second portion of the body region, under an embodiment; the drain region includes a highly-doped portion and a lightly-doped portion.

FIG. 17 shows an electrically floating body transistor 14 in which the first portion 18-1 of the body region is made discontinuous with the only the source by a second portion 18-2 of the body region, under an embodiment. The drain region includes a highly-doped portion and a lightly-doped portion.

Figure 18:
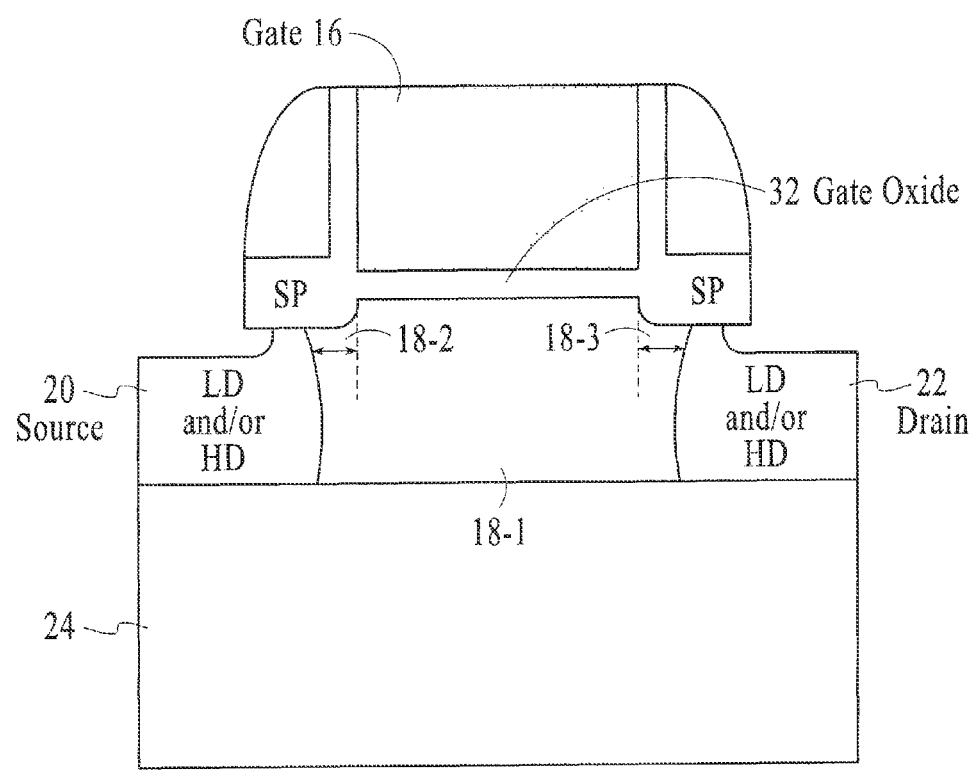
FIG. 18 shows an electrically floating body transistor in which the first portion of the body region is made discontinuous with both the source and drain regions, and each of the source and drain regions comprise LD and/or HD portions, under an embodiment.

FIG. 18 shows an electrically floating body transistor 14 in which the first portion 18-1 of the body region is made discontinuous with both the source and drain regions, and each of the source and drain regions comprise LD and/or HD portions, under an embodiment.

Figure 19:
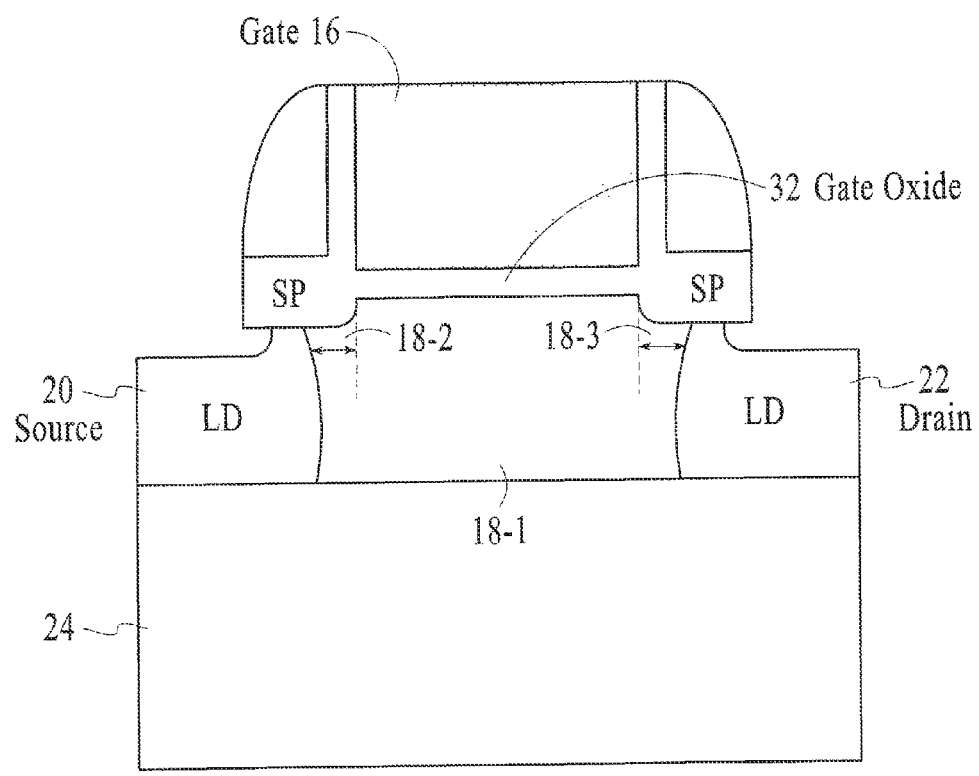
FIG. 19 shows an electrically floating body transistor in which the first portion of the body region is made discontinuous with both the source and drain regions, and each of the source and drain regions are LD, under an embodiment.

FIG. 19 shows an electrically floating body transistor 14 in which the first portion 18-1 of the body region is made discontinuous with both the source and drain regions, and each of the source and drain regions are LD, under an embodiment.

Figure 20:
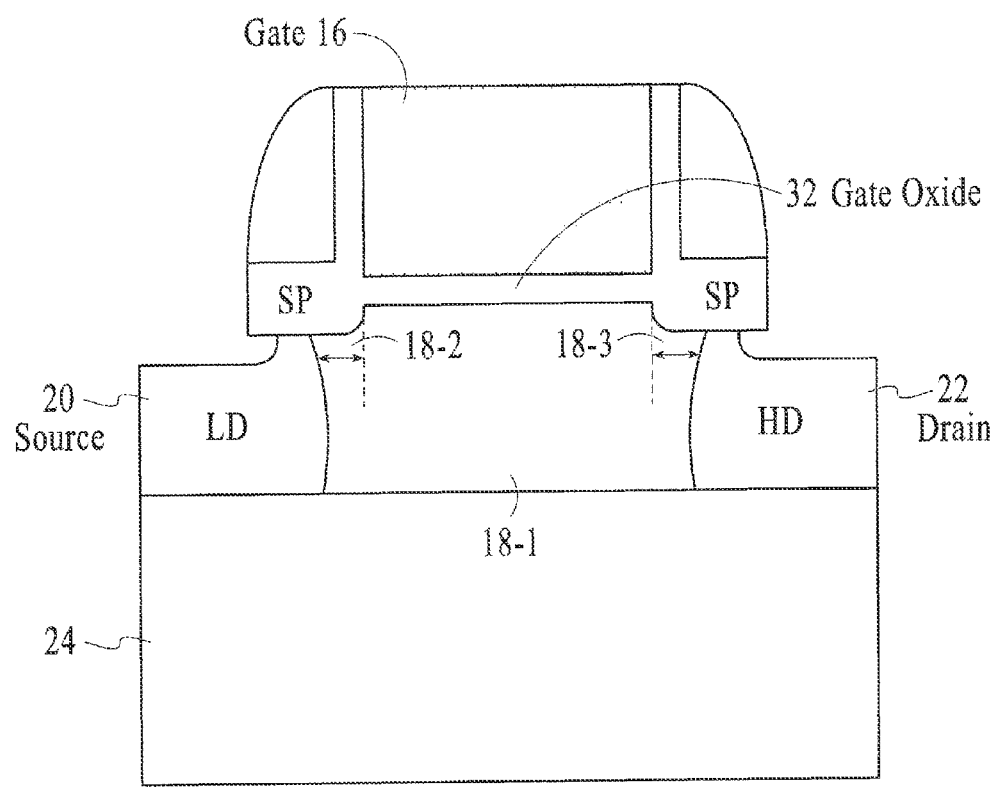
FIG. 20 shows an electrically floating body transistor in which the first portion of the body region is made discontinuous with both the source and drain regions, and the source region is LD and the drain region is HD, under an embodiment.

FIG. 20 shows an electrically floating body transistor 14 in which the first portion 18-1 of the body region is made discontinuous with both the source and drain regions, and the source region is LD and the drain region is HD, under an embodiment.

Figure 21:
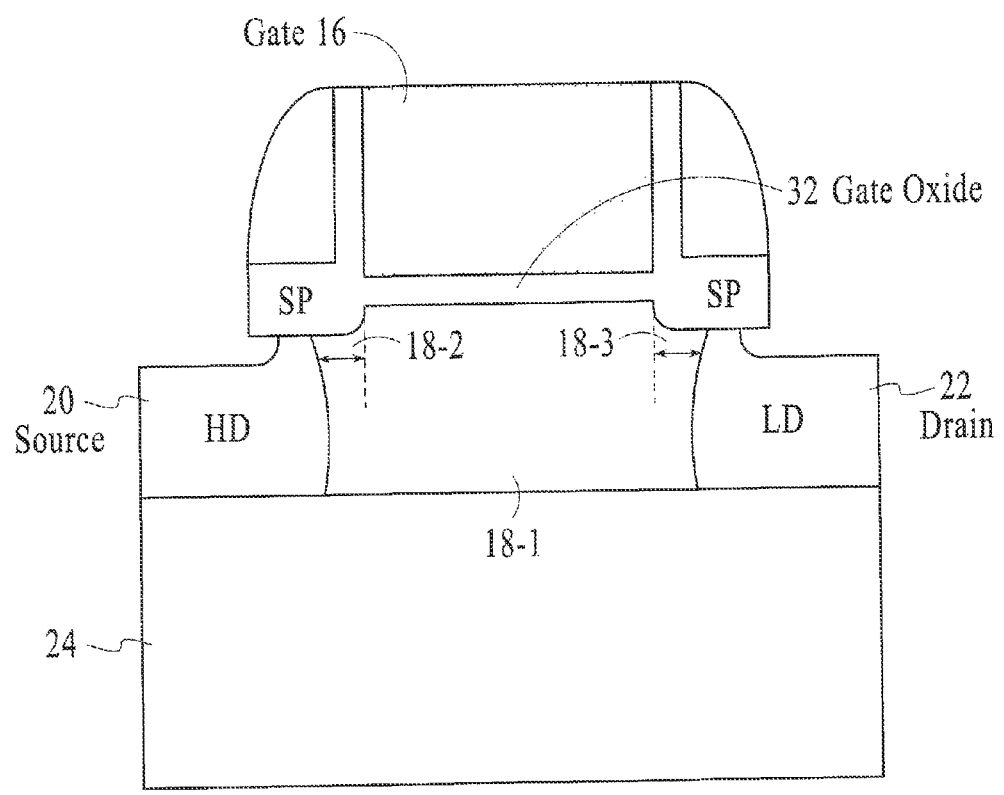
FIG. 21 shows an electrically floating body transistor in which the first portion of the body region is made discontinuous with both the source and drain regions, and the source region is HD and the drain region is LD, under an embodiment.

FIG. 21 shows an electrically floating body transistor 14 in which the first portion 18-1 of the body region is made discontinuous with both the source and drain regions, and the source region is HD and the drain region is LD, under an embodiment.

Figure 22:
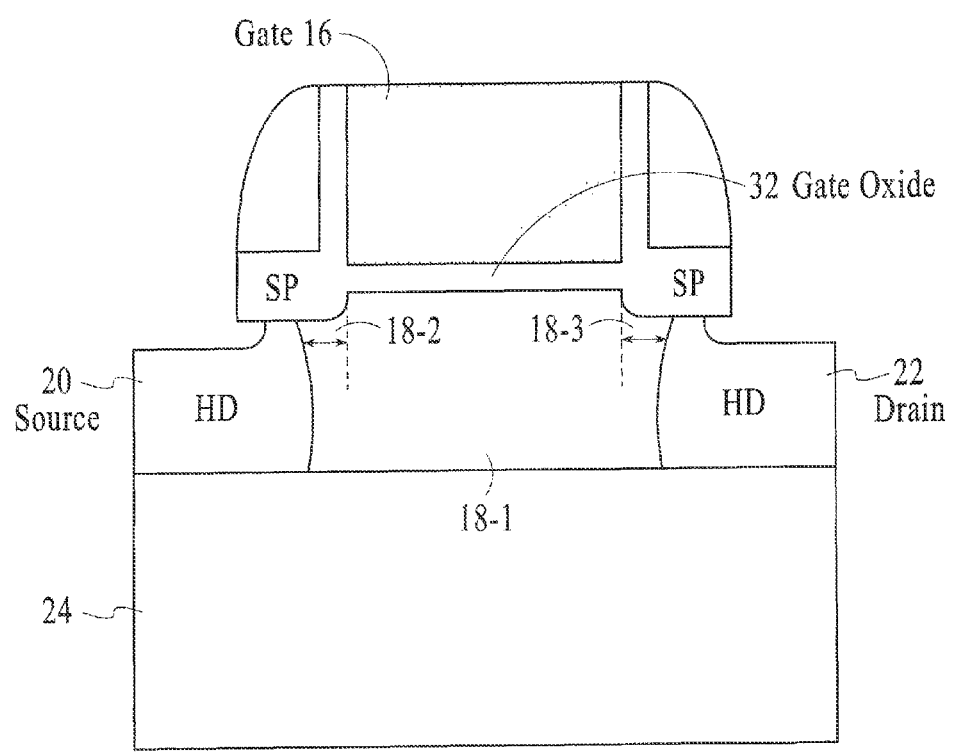
FIG. 22 shows an electrically floating body transistor in which the first portion of the body region is made discontinuous with both the source and drain regions, and each of the source and drain regions are HD, under an embodiment.

FIG. 22 shows an electrically floating body transistor 14 in which the first portion 18-1 of the body region is made discontinuous with both the source and drain regions, and each of the source and drain regions are HD, under an embodiment.

Figure 1A:
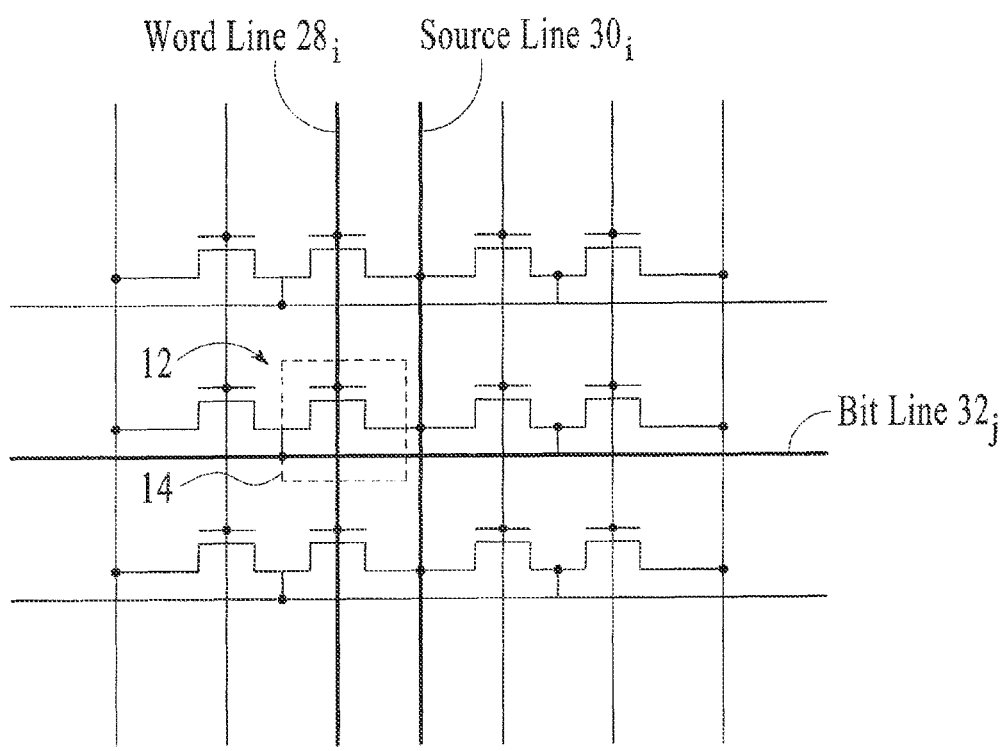
FIG. 1A is a schematic representation of a prior art DRAM array including a plurality of memory cells comprised of one electrically floating body transistor.
Figure 1B:
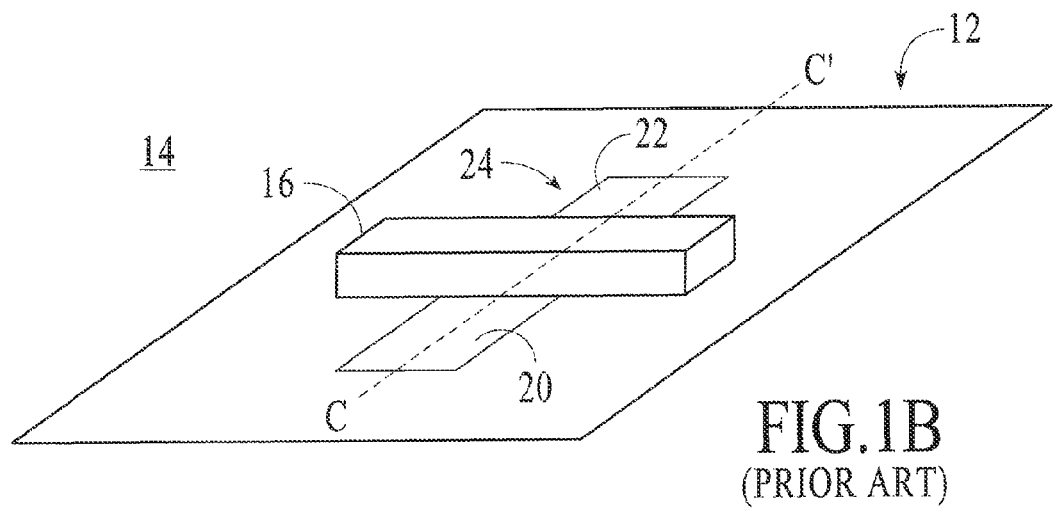
FIG. 1B is a three-dimensional view of an exemplary prior art memory cell comprised of one electrically floating body partially depleted transistor (PD-SOI NMOS)
Figure 1C:
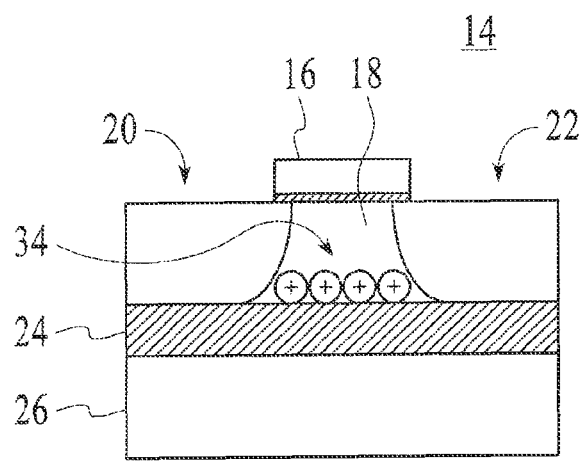
FIG. 1C is a cross-sectional view of the prior art memory cell of FIG. 1B, cross-sectioned along line C-C'.
Figure 2A:
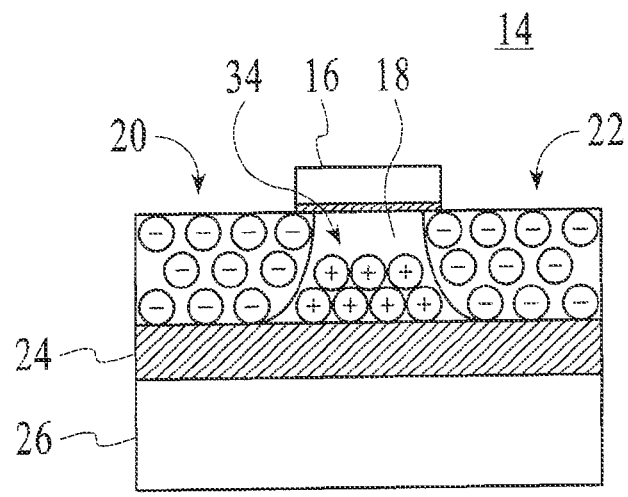
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
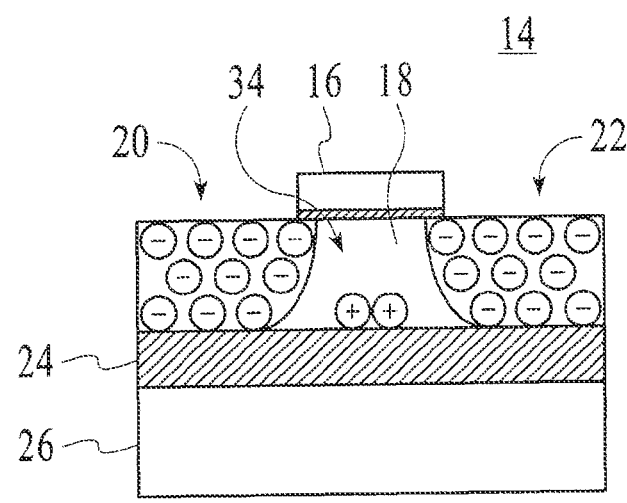
Figure 3A:
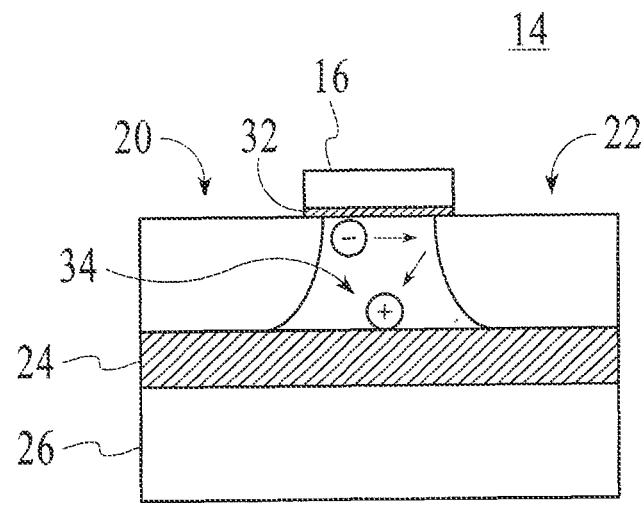
FIGS. 3A and 3B are exemplary schematic and general illustrations of conventional methods to program a memory cell to logic state "1" (i.e., generate or provide an excess of majority carrier in the electrically floating body of the transistor (an N-type channel transistor in this exemplary embodiment) of the memory cell of FIG. 1B; majority carriers in these exemplary embodiments are generated or provided by the channel electron impact ionization (FIG. 3A) and by GIDL or band to band tunneling (FIG. 3B)
Figure 3B:
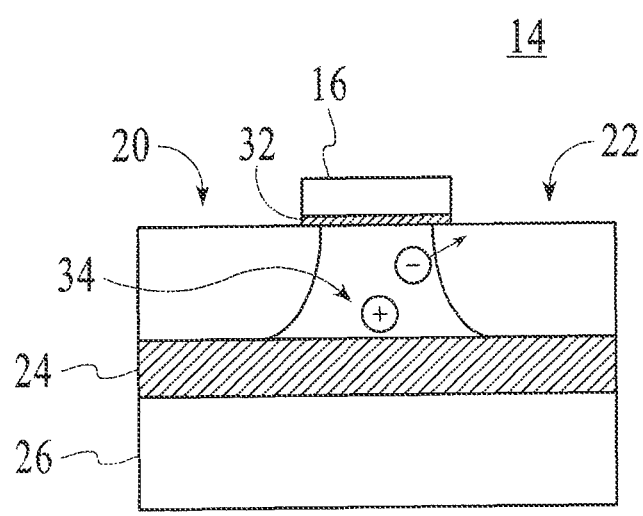
Figure 4A:
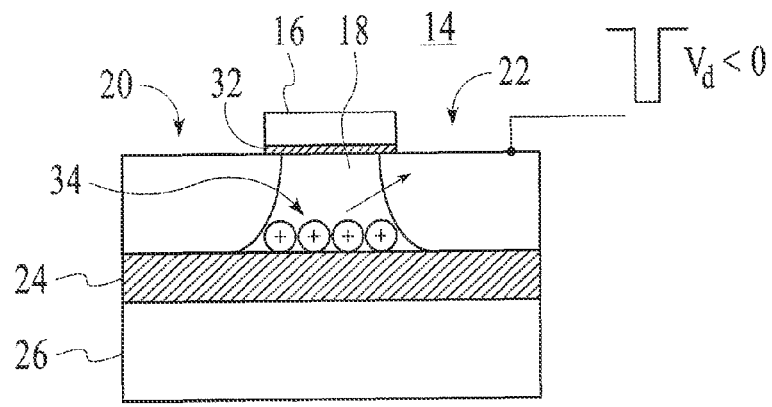
FIGS. 4A, 4B and 4C are exemplary schematics and general illustrations of conventional methods to program a memory cell to logic state "0" (i.e., provide relatively fewer majority carrier by removing majority carriers from the electrically floating body of the transistor of the memory cell of FIG. 1B; majority carriers may be removed through the drain region/terminal of the transistor (FIG. 4A), the source region/terminal of the transistor (FIG. 4B), and through both drain and source regions/terminals of the transistor via using the back gate pulses applied to the substrate/backside terminal of the transistor of the memory cell (FIG. 4C)
Figure 4B:
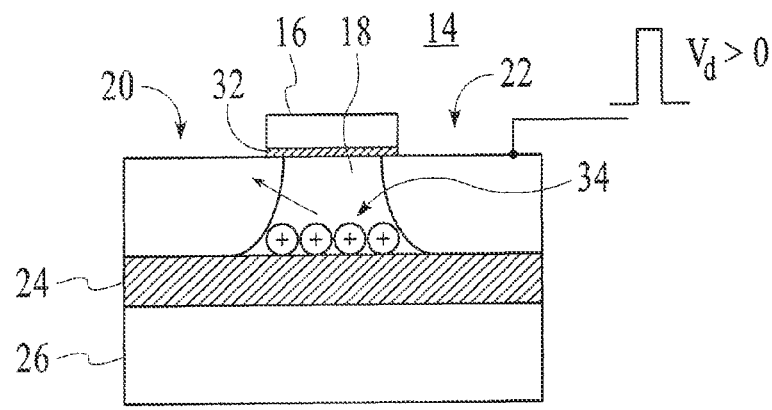
Figure 4C:
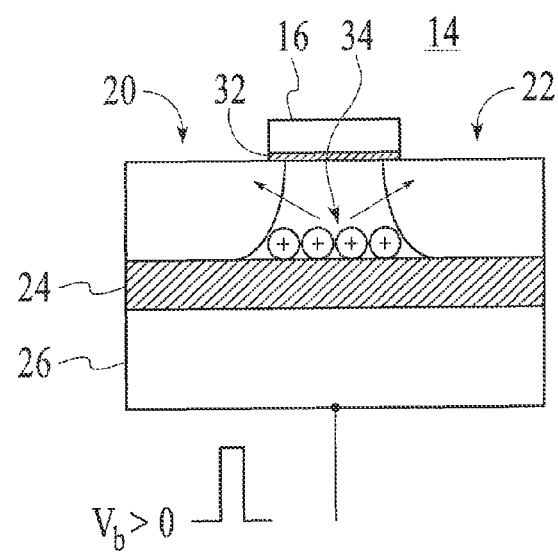
Figure 5:
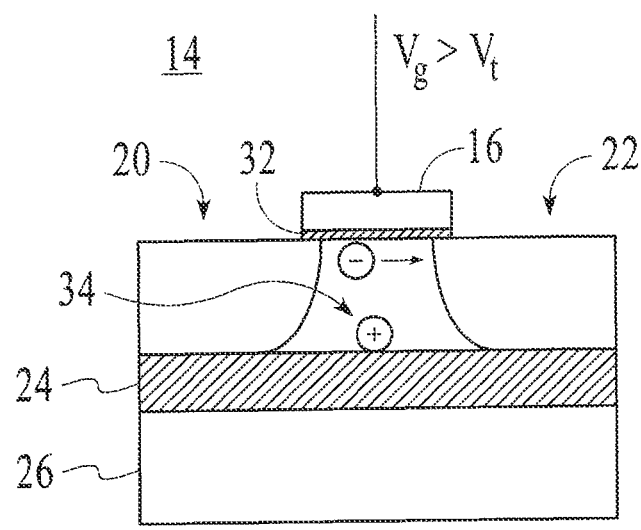
FIG. 5 illustrates an exemplary schematic (and control signal) of a conventional reading technique, the state of the memory cell may be determined by sensing the amount of the channel current provided/generated by the transistor of the memory cell in response to the application of a predetermined voltage on the gate of the transistor.

The programming techniques described above may consume less power relative to conventional techniques (e.g., FIGS. 4A and 4B). The reduced power consumption relates to the programming techniques of the present inventions being implemented without employing a back gate terminal (Compare, FIG. 4C), thereby reducing or eliminating the flow of any source current in the device when the device is in an "off" state. Furthermore, the current for writing or programming to logic "0" may be smaller when compared to such conventional techniques.

The gate oxide thickness in conventional devices is required to be substantial in order to not be broken down by the high electric field potential. The high electric field potential results from the relatively high potential difference required between the source and drain regions during write operations. In contrast, however, the embodiments of transistor 14 described herein produce a relatively lower potential difference between the source and drain regions during write operations. The lower potential difference results from the device configuration described above which includes an increased distance between the source and drain regions resulting from the configuration (e.g., size, shape, etc.) of the source and drain regions relative to the gate region. Because the electric field potential is reduced significantly with this design, the gate oxide region can be thinner.

As mentioned above, the present inventions may be implemented in an integrated circuit device (for example, a discrete memory device or a device having embedded memory) including a memory array having a plurality of memory cells arranged in a plurality of rows and columns wherein each memory cell includes an electrically floating body transistor. The memory arrays may comprise N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

Figure 23A:
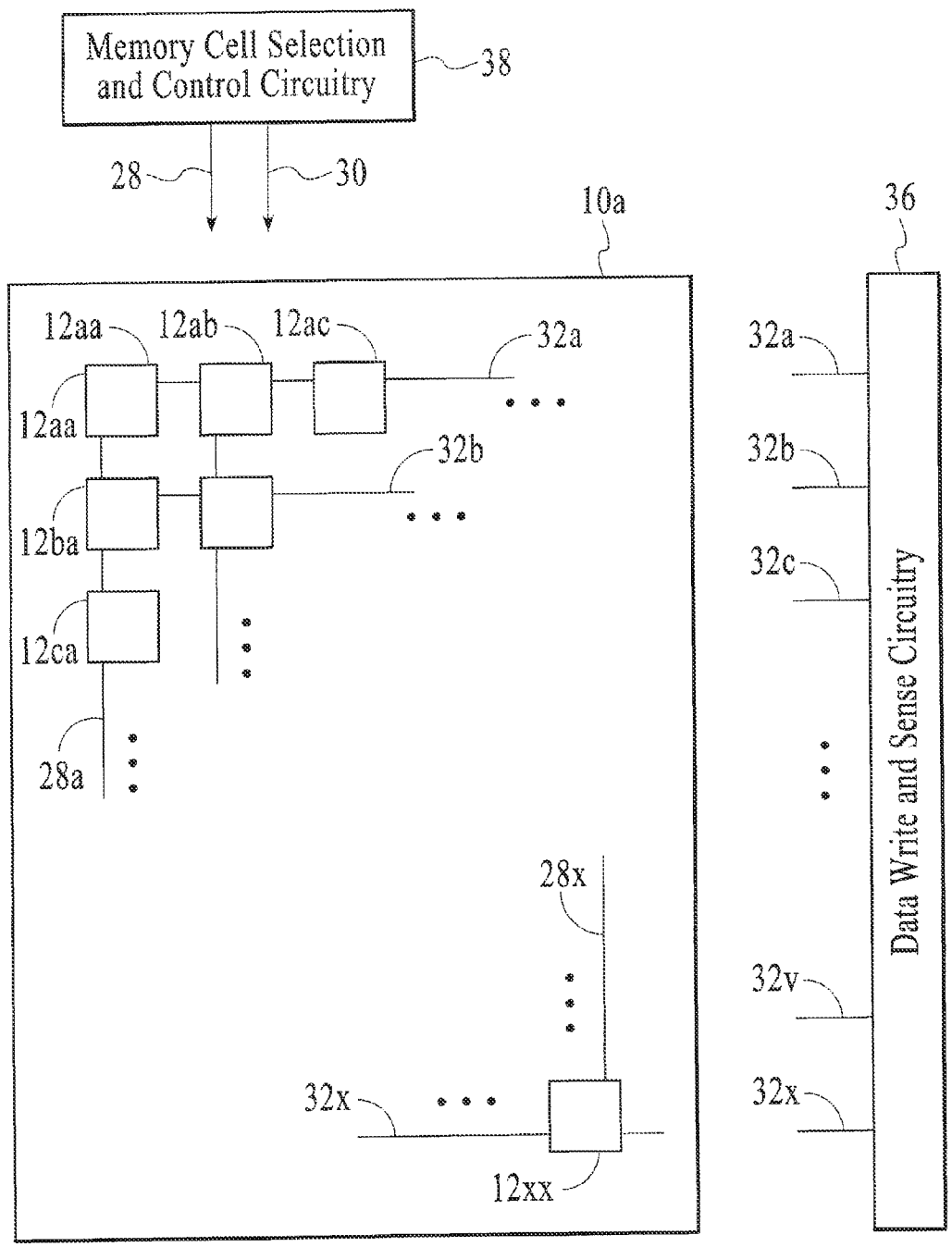
FIGS. 23A and 23B are schematic block diagrams of embodiments of an integrated circuit device including, among other things, a memory cell array, data sense and write circuitry, memory cell selection and control circuitry, according certain aspects of the present inventions.
Figure 23B:
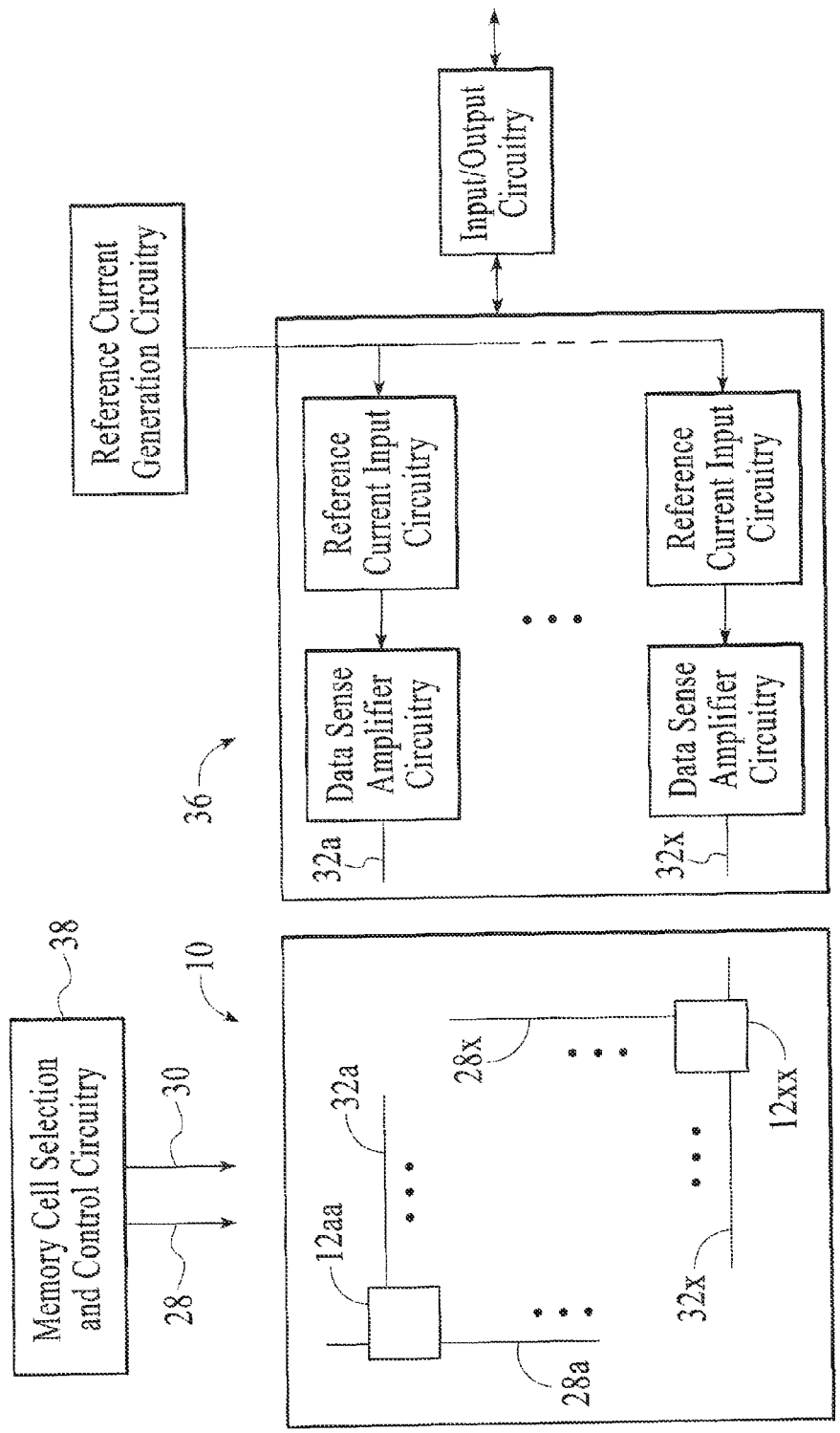

For example, with reference to FIGS. 23A and 23B, the integrated circuit device may include array 10, having a plurality of memory cells 12, data write and sense circuitry 36, and memory cell selection and control circuitry 38. The data write and sense circuitry 36 reads data from and writes data to selected memory cells 12. In one embodiment, data write and sense circuitry 36 includes a plurality of data sense amplifiers. Each data sense amplifier receives at least one bit line 32 and an output of reference generator circuitry (for example, a current or voltage reference signal). In one embodiment, the data sense amplifier may be a cross-coupled type sense amplifier as described and illustrated in U.S. Pat. No. 7,301,838, filed by Waller and Carman, on Dec. 12, 2005, and entitled "Sense Amplifier Circuitry and Architecture to Write Data into and/or Read Data from Memory Cells", the application being incorporated herein by reference in its entirety) to sense the data state stored in memory cell 12 and/or write-back data into memory cell 12.

The data sense amplifier may employ voltage and/or current sensing circuitry and/or techniques. In the context of current sensing, a current sense amplifier may compare the current from the selected memory cell to a reference current, for example, the current of one or more reference cells. From that comparison, it may be determined whether memory cell 12 contained logic high (relatively more majority carries 34 contained within body region 18) or logic low data state (relatively less majority carries 28 contained within body region 18). Notably, the present inventions may employ any type or form of data write and sense circuitry 36 (including one or more sense amplifiers, using voltage or current sensing techniques, to sense the data state stored in memory cell 12) to read the data stored in memory cells 12 and/or write data in memory cells 12.

Memory cell selection and control circuitry 38 selects and/or enables one or more predetermined memory cells 12 to facilitate reading data from and/or writing data to the memory cells 12 by applying a control signal on one or more word lines 28. The memory cell selection and control circuitry 38 may generate such control signals using address data, for example, row address data. Indeed, memory cell selection and control circuitry 38 may include a conventional word line decoder and/or driver. There are many different control/selection techniques (and circuitry) to implement the memory cell selection technique. Such techniques, and circuitry, are well known to those skilled in the art. All such control/selection techniques, and circuitry, whether now known or later developed, are intended to fall within the scope of the present inventions.

The present inventions may be implemented in any architecture, layout, and/or configuration comprising memory cells having electrically floating body transistors. For example, in one embodiment, memory array 10 including a plurality of memory cells 12 having a separate source line for each row of memory cells (a row of memory cells includes a common word line connected to the gates of each memory cell of the row). (See, for example, FIGS. 24, 25 and 26). The memory array 10 may employ one or more of the example programming, reading and/or holding techniques described above.

In one embodiment, the present inventions are implemented in conjunction with a two step write operation whereby all the memory cells of a given row are written to a predetermined data state by first executing a "clear" operation, whereby all of the memory cells of the given row are written or programmed to logic "0", and thereafter selective memory cells of the row are selectively write operation to the predetermined data state (here logic "1"). The present inventions may also be implemented in conjunction with a one step write operation whereby selective memory cells of the selected row are selectively written or programmed to either logic "1" or logic "0" without first implementing a "clear" operation.

Figure 24:
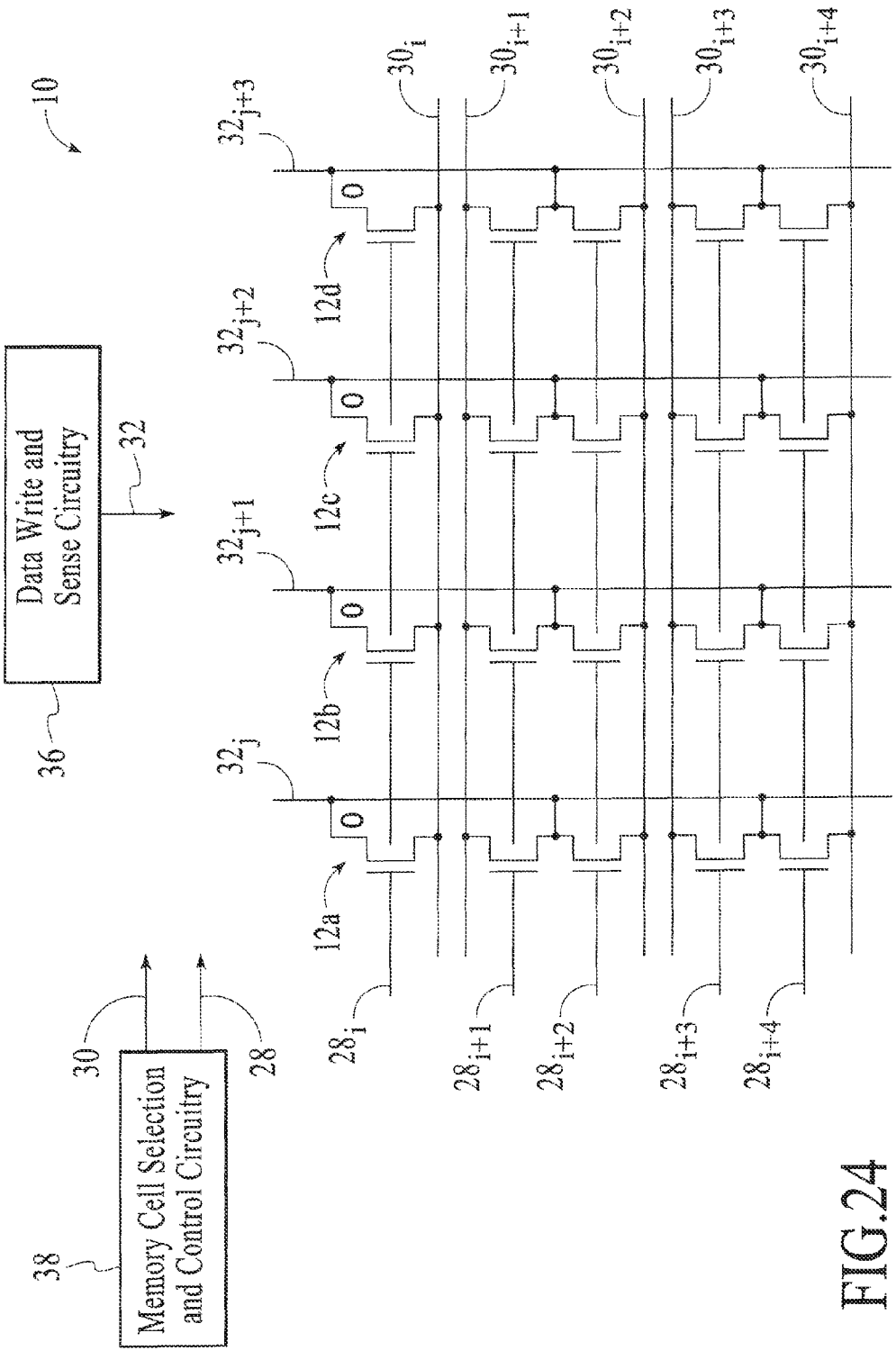
FIGS. 24, 25 and 26 illustrate an embodiment of an exemplary memory array having a plurality of memory cells and employing a separate source line configuration for each row of memory cells, according to certain aspects of the present inventions.
Figure 25:
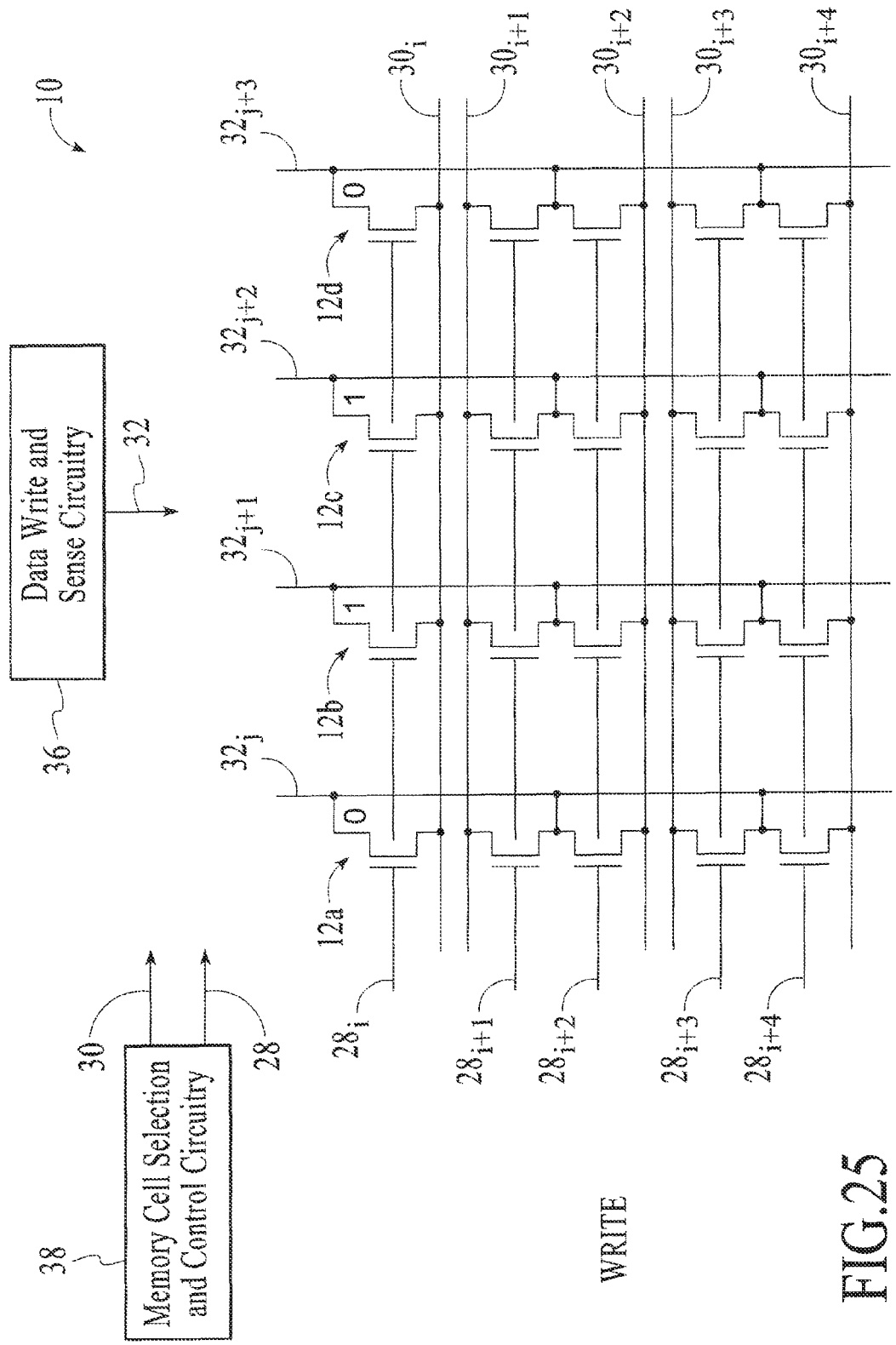
Figure 26:
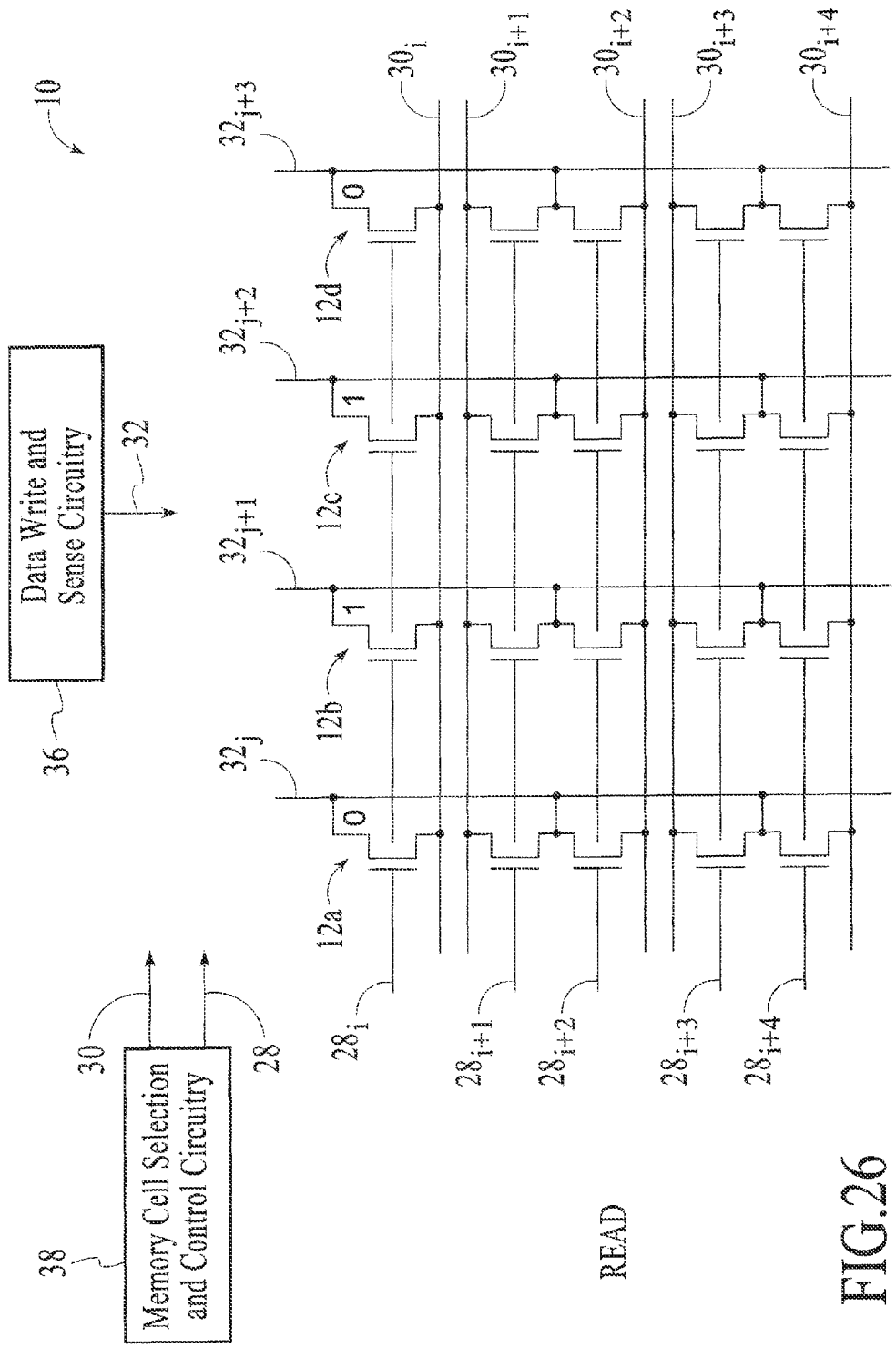

With reference to FIGS. 24 and 25, memory cells 12 may be programmed using the two step operation wherein a given row of memory cells are written to a first predetermined data state by first executing a "clear" operation (which, in this example embodiment, all of the memory cells of the given row are written or programmed to logic "0") and thereafter selected memory cells are written to a second predetermined data state (i.e., a selective write operation to the second predetermined data state). The "clear" operation may be performed by writing or programming each memory cell of the given row to a first predetermined data state (in this example embodiment the first predetermined data state is logic "0") using the inventive technique described above.

In particular, transistor of each memory cell 12 of a given row (for example, memory cells 12a-12d) is controlled to store logic "0". In this regard, stage one and stage two control signals to implement a clear operation as described above are applied to the gate, the source region and the drain region of the transistor of memory cells 12a-12d. In response, the same logic state (for example, logic low or logic "0") is stored in memory cells 12a-12d and the state of memory cells 12a-12d are "cleared".

Thereafter, selected memory cells of the given row may be programmed to the second predetermined logic state. In this regard, the transistors of certain memory cells of a given row are written to the second predetermined logic state in order to store the second predetermined logic state in memory cells. For example, with reference to FIG. 25, memory cells 12b and 12c are programmed to logic high or logic "1" by applying (i) 0.5 v to the gate (via word line $28_i$), (ii) 0 v to the source region (via source line 30), and (iii) 2.5 v to the drain region (via bit line $32_{j+1}$ and $32_{j+2}$), followed by application of −1.0 v to the gate (via word line $28_i$). In particular, such control signals generate or provide an excess of majority carriers in the electrically floating body region of the transistor of memory cells 12b and 12c which corresponds to logic high or logic "1".

As mentioned above, it is preferred that the source current responsible for impact ionization and/or avalanche multiplication in the floating body is initiated or induced by the control signal (control pulse) applied to the gate of the transistor. Such a signal/pulse may induce the channel impact ionization which raises or increases the potential of the electrically floating body region of the transistor of memory cells 12b and 12c and "turns-on" and/or produces a source current in transistor 14. One advantage of the proposed method is that a large amount of the excess majority carriers may be generated and stored in the electrically floating body region of the transistor of memory cells 12b and 12c.

Notably, in this example embodiment, memory cells 12a and 12d are maintained at logic low (or logic "0") by applying an inhibit control signal to the drain region of each memory cell 12a and 12d. For example, applying 0 v to the drain regions of memory cells 12a and 12d (via bit lines $32_j$ and $32_{j+4}$) inhibits writing logic high or logic "1" into memory cells 12a and 12d during the selective write operation for memory cells 12b and 12c.

A "holding" operation or condition may be used for the other memory cells in memory cell array 10 to minimize and/or reduce the impact of the write operation for memory cells 12a-12d connected to word line $28_i$. With reference to FIGS. 24 and 25, in one embodiment, a holding voltage is applied to the gates of the transistors of other memory cells of memory cell array 10 (for example, each memory cell connected to word lines $28_{i+1}$, $28_{i+2}$, $28_{i+3}$, and $28_{i+4}$). In one example embodiment, a holding voltage of −1.2 v is applied to the gate of each transistor of the memory cells connected to word lines $28_{i+1}$, $28_{i+2}$, $28_{i+3}$, and $28_{i+4}$. In this way, the impact of the write operation of memory cells 12a-12d (which are connected to word line $28_i$) on the other memory cells of memory cell array 10 is minimized and/or reduced.

A selected row of memory cells may be read by applying read control signals to the associated word line 28 and associated source lines 30 and sensing a signal (voltage and/or current) on associated bit lines 32. In one example embodiment, with reference to FIG. 26, memory cells 12a-12d are read by applying (i) −1.0 v to the gate (via word line $28_i$), (ii) 0 v to the source region (via source line 30) and (iii) 2.5 v to the drain region (via bit line $32_{j+1}$ and $32_{j+2}$). The data write and sense circuitry 36 reads the data state of the memory cells 12a-12d by sensing the response to the applied read control signals. In response to the read control signals, memory cells 12a-12d generate a source current which is representative of the data state of memory cells 12a-12d. In this example, memory cells 12b and 12c (which were earlier programmed to logic "1"), in response to the read control signals, generate a source current which is considerably larger than any channel current. In contrast, memory cells 12a and 12d (which were earlier programmed to logic "0"), such control signals induce, cause and/or produce little to no source current (for example, a considerable, substantial or sufficiently measurable source current). The sense circuitry 36 senses the data state using primarily and/or based substantially on the source current.

Thus, in response to read control signals, the electrically floating body transistor of each memory cell 12a-12d generates a source current which is representative of the data state stored therein. The data sensing circuitry in data write and sense circuitry 36 determines the data state of memory cells 12a-12d based substantially on the source current induced, caused and/or produced in response to the read control signals. Notably, as mentioned above, a read operation may be performed by applying other control signaling techniques.

Again, it may be advantageous to employ a "holding" operation or condition for the other memory cells in memory cell array 10 to minimize and/or reduce the impact of the read operation of memory cells 12a-12d. With continued reference to FIG. 26, in one embodiment, a holding voltage is applied to the gates of the transistors of other memory cells of memory cell array 10 (for example, each memory cell connected to word lines $28_{i+1}$, $28_{i+2}$, $28_{i+3}$, and $28_{i+4}$). In one example embodiment, a holding voltage of −1.2 v is applied to the gate of each transistor of the memory cells connected to word lines $28_{i+1}$, $28_{i+2}$, $28_{i+3}$, and $28_{i+4}$. In this way, the impact of the read operation of memory cells 12a-12d (which are connected to word line $28_i$) on the other memory cells of memory cell array 10 is minimized and/or reduced.

The programming and reading techniques described herein may be used in conjunction with a plurality of memory cells arranged in an array of memory cells. A memory array implementing the structure and techniques of the present inventions may be controlled and configured including a plurality of memory cells having a separate source line for each row of memory cells (a row of memory cells includes a common word line). The memory array may use any of the example programming, holding and/or reading techniques described herein. The memory arrays may comprise N-channel, P-channel and/or both types of transistors. Circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells in the memory array(s), suitable write and read voltages (for example, negative voltages) are well known to those skilled in the art in light of this disclosure.

The present inventions may be implemented in any electrically floating body memory cell and memory cell array. For example, in certain aspects, the present inventions are directed to a memory array, having a plurality of memory cells each including an electrically floating body transistor, and/or technique of programming data into one or more memory cells of such a memory cell array. In this aspect of the inventions, the data states of adjacent memory cells and/or memory cells that share a word line may or may not be individually programmed.

With reference to FIGS. 23A and 23B, memory array 10 may comprise a plurality of memory cells 12 of N-channel type, P-channel type and/or both types of electrically floating body transistors. The memory array 10 includes a plurality of rows and columns (for example, in a matrix form) of memory cells 12.

The circuitry which is peripheral to memory array 10 (for example, data write and sense circuitry 36 (such as, for example, sense amplifiers or comparators), memory cell selection and control circuitry 38 (such as, for example, address decoders and word line drivers)) may include P-channel type and/or N-channel type transistors. Where N-channel type transistors or P-channel type transistors are employed as memory cells 12 in memory array(s) 10, suitable write voltages are known to those skilled in the art.

As mentioned above, memory cells 12 (having electrically floating body transistor 14) and memory cell array 10 of the present inventions may be implemented in an integrated circuit device having a memory portion and a logic portion (see, for example, FIG. 23A), or an integrated circuit device that is primarily a memory device (see, for example, FIG. 23B). Indeed, the present inventions may be implemented in any device having one or more memory cells 12 (having electrically floating body transistors) and/or memory cell arrays 10. For example, with reference to FIG. 23A, an integrated circuit device may include array 10, having a plurality of memory cells 12 (having electrically floating body transistors), data write and sense circuitry, and memory cell selection and control circuitry (not illustrated in detail). The data write and sense circuitry writes data into and senses the data state of one or more memory cells. The memory cell selection and control circuitry selects and/or enables one or more predetermined memory cells 12 to be read by data sense circuitry during a read operation.

For example, the electrically floating body transistor, which programmed (written to), controlled and/or read using the techniques of the present inventions, may be employed in any electrically floating body memory cell, and/or memory cell array architecture, layout, structure and/or configuration employing such electrically floating body memory cells. In this regard, an electrically floating body transistor, which state is read using the techniques of the present inventions, may be implemented in the memory cell, architecture, layout, structure and/or configuration described and illustrated in the following U.S. patents and non-provisional U.S. patent applications:

(1) U.S. Pat. No. 6,969,662, which was filed by Fazan et al. on Jun. 10, 2003 and entitled "Semiconductor Device";

(2) U.S. Pat. No. 7,061,050, which was filed by Fazan et al. on Feb. 18, 2004 and entitled "Semiconductor Device";

(3) U.S. Pat. No. 7,085,153, which was filed by Ferrant et al. on Apr. 22, 2004 and entitled "Semiconductor Memory Cell, Array, Architecture and Device, and Method of Operating Same";

(4) U.S. Pat. No. 7,187,581, which was filed by Ferrant et al. on Mar. 14, 2005 and entitled "Semiconductor Memory Device and Method of Operating Same", and which is a divisional application of U.S. patent application Ser. No. 10/840,009 (now abandoned);

(5) U.S. Pat. No. 7,184,298, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same";

(6) U.S. patent application Ser. No. 11/724,552, which was filed by Carman on Mar. 15, 2007 and entitled "Memory Array Having a Programmable Word Length, and Method of Operating Same" (U.S. Patent Application Publication No. 2007/0285982);

(7) U.S. patent application Ser. No. 11/787,718, which was filed by Popoff on Apr. 17, 2007 and entitled "Semiconductor Memory Array Architecture, and Method of Controlling Same" (U.S. Patent Application Publication No. 2007/0241405); and (8) U.S. patent application Ser. No. 11/821,848, which was filed by Fisch et al. on Jun. 26, 2007 and entitled "Integrated Circuit Including Memory Array Having a Segmented Bit Line Architecture and Method of Controlling and/or Operating Same" (U.S. Patent Application Publication No. 2008/0013359).

Notably, the memory cells may be controlled (for example, programmed or read) using any of the control circuitry described and illustrated in the above-referenced eight (8) U.S. patents and patent applications. For the sake of brevity, those discussions will not be repeated; such control circuitry is incorporated herein by reference. Indeed, all memory cell selection and control circuitry for programming, reading, controlling and/or operating memory cells including electrically floating body transistors, whether now known or later developed, are intended to fall within the scope of the present inventions.

Moreover, the data write and data sense circuitry may include a sense amplifier (not illustrated in detail herein) to read the data stored in memory cells 12. The sense amplifier may sense the data state stored in memory cell 12 using voltage or current sensing circuitry and/or techniques. In the context of a current sense amplifier, the current sense amplifier may compare the cell current to a reference current, for example, the current of a reference cell (not illustrated). From that comparison, it may be determined whether memory cell 12 contained logic high (relatively more majority carriers 34 contained within body region 18) or logic low data state (relatively less majority carriers 34 contained within body region 18). Such circuitry and configurations thereof are well known in the art.

In addition, the present inventions may employ the reference generation techniques (used in conjunction with the data sense circuitry for the read operation) described and illustrated in U.S. patent application Ser. No. 11/515,667, "Method and Circuitry to Generate a Reference Current for Reading a Memory Cell, and Device Implementing Same" filed Sep. 5, 2006 by Bauser, and claiming the benefit of U.S. Provisional Patent Application Ser. No. 60/718,417, which was filed by Bauser on Sep. 19, 2005, and entitled "Method and Circuitry to Generate a Reference Current for Reading a Memory Cell Having an Electrically Floating Body Transistor, and Device Implementing Same". The entire contents of the U.S. patent application Ser. No. 11/515,667 are incorporated herein by reference. Further, the present inventions may also employ the read circuitry and techniques described and illustrated in U.S. Pat. No. 6,912,150, which was filed by Portmann et al. on May 7, 2004, and entitled "Reference Current Generator, and Method of Programming, Adjusting and/or Operating Same". The contents of U.S. Pat. No. 6,912,150 are hereby incorporated by reference herein.

It should be further noted that while each memory cell 12 in the example embodiments (described above) includes one transistor 14, memory cell 12 may include two transistors, as described and illustrated in U.S. Pat. No. 7,085,153, which was filed by Ferrant et al. on Apr. 22, 2004 and entitled "Semiconductor Memory Cell, Array, Architecture and Device, and Method of Operating Same". The contents of U.S. Pat. No. 7,085,153 are hereby incorporated by reference herein.

Moreover, the present inventions may be components of or integrated with multi-bit memory cell applications as described in U.S. Non-Provisional patent application Ser. No. 11/703,429, which was filed by Okhonin on Feb. 7, 2007, and entitled "Multi-Bit Memory Cell Having Electrically Floating Body Transistor, and Method of Programming and Reading Same" (U.S. Patent Application Publication No. 2007/0187775).

The electrically floating memory cells, transistors and/or memory array(s) may be fabricated using well known techniques and/or materials. Indeed, any fabrication technique and/or material, whether now known or later developed, may be employed to fabricate the electrically floating memory cells, transistors and/or memory array(s). For example, the present inventions may employ silicon, germanium, silicon/germanium, gallium arsenide or any other semiconductor material (whether bulk-type or SOI) in which transistors may be formed. As such, the electrically floating memory cells may be disposed on or in (collectively "on") SOI-type substrate or a bulk-type substrate.

Indeed, the electrically floating transistors, memory cells, and/or memory array(s) may employ the techniques described and illustrated in non-provisional patent applications entitled "Integrated Circuit Device, and Method of Fabricating Same", which was filed on Jul. 2, 2004, by Fazan, Ser. No. 10/884,481 (U.S. Patent Application Publication No. 2005/0017240), and "One Transistor Memory Cell having a Strained Electrically Floating Body Region, and Method of Operating Same", which was filed on Oct. 12, 2006, by Bassin, Ser. No. 11/580,169 (U.S. Patent Application Publication No. 2007/0085140), and/or "Memory Cell and Memory Cell Array Having an Electrically Floating Body Transistor, and Methods of Operating Same", by Okhonin, Ser. No. 11/509,188 (U.S. Patent Application Publication No. 2007/0058427), which claims the benefit of provisional patent application entitled "Memory Cell, Array and Device, and Method of Operating Same", which was filed on Oct. 19, 2005, Ser. No. 60/728,061, by Okhonin et al. (hereinafter collectively "Integrated Circuit Device Patent Applications"). The contents of the Integrated Circuit Device Patent Applications are hereby incorporated by reference herein.

Memory array 10 (including SOI memory transistors) further may be integrated with SOI logic transistors, as described and illustrated in the Integrated Circuit Device Patent Applications. For example, in one embodiment, an integrated circuit device includes memory section (having, for example, partially depleted (PD) or fully depleted (FD) SOI memory transistors 14) and logic section (having, for example, high performance transistors, multiple gate transistors, and/or non-high performance transistors (for example, single gate transistors that do not possess the performance characteristics of high performance transistors).

Further, memory array(s) 10 may be comprised of N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include FD-type transistors (whether P-channel and/or N-channel type). Alternatively, such circuitry may include PD-type transistors (whether P-channel and/or N-channel type). There are many techniques to integrate both PD and/or FD-type transistors on the same substrate (see, for example, U.S. Pat. No. 7,061,050, which was filed by Fazan et al. on Feb. 18, 2004 and entitled "Semiconductor Device"). All such techniques, whether now known or later developed, are intended to fall within the scope of the present inventions. Where P-channel type transistors are employed as memory cells 12 in the memory array(s), suitable write and read voltages (for example, negative voltages) are well known to those skilled in the art in light of this disclosure.

Notably, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

Aspects of the present inventions described herein, and/or embodiments thereof, may include a semiconductor device comprising one or more of: a body region configured to be electrically floating; a gate disposed over a first portion of the body region; a source region adjoining a second portion of the body region, the second portion adjacent the first portion and separating the source region from the first portion; and a drain region adjoining a third portion of the body region, the third portion adjacent the first portion and separating the drain region from the first portion.

The device of an embodiment includes a first voltage coupled to the gate. The first voltage may cause minority carriers to accumulate in the first portion of the body region.

The minority carriers that may accumulate in an embodiment accumulate at a surface region of the first portion of body region that is juxtaposed or near a gate dielectric which is disposed between the gate and the first portion of the body region.

The region of the device of an embodiment that includes the minority carriers is disconnected from the source region by the second portion of the body region.

The region of the device of an embodiment that includes the minority carriers is disconnected from the drain region by the third portion of the body region.

The device of an embodiment includes a first potential difference coupled between the source and the drain, the first potential difference generating source current as a result of impact ionization induced by the minority carriers.

The device of an embodiment includes a second voltage coupled to the gate after and instead of the first voltage, the second voltage causing an accumulation of majority carriers in the first portion of the body region, wherein the majority carriers result in the first data state which is representative of a first charge in the body region.

The device of an embodiment includes a second potential difference coupled between the source and the drain, the second potential difference resulting in a second data state which is representative of a second charge in the body region.

The device of an embodiment includes an insulating layer disposed between the gate and the body region.

The body region of the device of an embodiment includes a first type of semiconductor material.

The source region and drain region of the device of an embodiment includes a second type of semiconductor material.

The source region of the device of an embodiment includes a lightly doped region.

The source region of the device of an embodiment includes a highly doped region.

The source region of the device of an embodiment includes a lightly doped region and a highly doped region.

The drain region of the device of an embodiment includes a lightly doped region.

The drain region of the device of an embodiment includes a highly doped region.

The drain region of the device of an embodiment includes a lightly doped region and a highly doped region.

Aspects of the present inventions described herein, and/or embodiments thereof, may include a semiconductor device comprising one or more of: a gate; a body region partially disposed under the gate and electrically floating; and a source region and a drain region adjacent the body region, wherein one or more of the source region and the drain region include a doped region shaped so that a farthermost boundary of the doped region is separated from a portion of the body region underlying the gate.

Aspects of the present inventions described herein, and/or embodiments thereof, may include a semiconductor device comprising one or more of: a gate; a body region configured as an electrically floating body, the body region configured so that material forming the body region extends beyond at least one lateral boundary of the gate; and a source region and a drain region adjacent the body region.

Aspects of the present inventions described herein, and/or embodiments thereof, may include a transistor comprising one or more of: a floating body region on an insulating substrate; a gate disposed over a portion of the floating body region; and a source region and a drain region, wherein a doping profile of one or more of the source and the drain region is configured to prevent formation of a contiguous current channel extending between the source region and the drain region through the floating body region.

Aspects of the present inventions described herein, and/or embodiments thereof, may include a method for forming a transistor, comprising one or more of: forming a semiconductor on an insulator; forming an insulating layer and a gate over a first portion of the semiconductor; forming spacers over a second portion and a third portion of the semiconductor, the spacers adjoining the insulating layer, wherein the first portion, second portion, and third portion form a floating body region; forming a source region by implanting an impurity into a fourth portion of the semiconductor after forming the spacers, the fourth portion adjacent the second portion; and forming a drain region by implanting the impurity into a fifth portion of the semiconductor after forming the spacers, the fifth portion adjacent the third portion.

The body region formed under the method of forming a transistor of an embodiment comprises a first type of semiconductor material.

The source region and drain region formed under the method of forming a transistor of an embodiment each comprise a second type of semiconductor material that is different from the first type.

Implanting the impurity into the fourth portion under the method of forming a transistor of an embodiment includes implanting to form a lightly doped source region.

Implanting the impurity into the fourth portion under the method of forming a transistor of an embodiment includes implanting to form a highly doped source region.

Implanting the impurity into the fourth portion under the method of forming a transistor of an embodiment includes implanting to form a source region that includes both a lightly doped source portion and a highly doped source portion.

Implanting the impurity into the fifth portion under the method of forming a transistor of an embodiment includes implanting to form a lightly doped drain region.

Implanting the impurity into the fifth portion under the method of forming a transistor of an embodiment includes implanting to form a highly doped drain region.

Implanting the impurity into the fifth portion under the method of forming a transistor of an embodiment includes implanting to form a drain region that includes both a lightly doped drain portion and a highly doped drain portion.

Aspects of the present inventions described herein, and/or embodiments thereof, may include a method for forming an integrated circuit device, the method comprising one or more of: forming a semiconductor on an insulator; forming an insulating layer and a gate over a first portion of the semiconductor; forming spacers over a second portion and a third portion of the semiconductor, the spacers adjoining the insulating layer, wherein the first portion, second portion, and third portion form a floating body region; forming a source region by implanting an impurity into a fourth portion of the semiconductor after forming the spacers, the fourth portion adjacent the second portion; and forming a drain region by implanting the impurity into a fifth portion of the semiconductor after forming the spacers, the fifth portion adjacent the third portion.

Aspects of the present inventions described herein, and/or embodiments thereof, may include a method for forming a semiconductor device, the semiconductor device produced by the method comprising one or more of: a body region configured to be electrically floating; a gate disposed over a first portion of the body region; a source region adjoining a second portion of the body region, the second portion adjacent the first portion and separating the source region from the first portion; and a drain region adjoining a third portion of the body region, the third portion adjacent the first portion and separating the drain region from the first portion.

Aspects of the present inventions described herein, and/or embodiments thereof, may include an integrated circuit device comprising one or more of: a memory cell including a transistor, the transistor comprising one or more of a body region configured to be electrically floating, a gate disposed over a first portion of the body region, a source region adjoining a second portion of the body region, the second portion adjacent the first portion and separating the source region from the first portion, and a drain region adjoining a third portion of the body region, the third portion adjacent the first portion and separating the drain region from the first portion; wherein the memory cell includes a first data state representative of a first charge in the first portion of the body region, wherein the memory cell includes a second data state representative of a second charge in the first portion of the body region; data write circuitry coupled to the memory cell, the data write circuitry configured to apply first write control signals to the memory cell to write the first data state and second write control signals to the memory cell to write the second data state, wherein, in response to first write control signals, the electrically floating body transistor generates a first source current which substantially provides the first charge in the first portion of the body region.

The first write control signals of the integrated circuit device of an embodiment cause, provide, produce and/or induce the first source current.

The first write control signals of the integrated circuit device of an embodiment include a signal applied to the gate and a signal applied to the source region, wherein the signal applied to the gate includes a first voltage having a first amplitude and a second voltage having a second amplitude.

The first write control signals of the integrated circuit device of an embodiment include a signal applied to the gate and a signal applied to the drain region, wherein the signal applied to the gate includes a first voltage having a first amplitude and a second voltage having a second amplitude.

The first write control signals of the integrated circuit device of an embodiment include a potential difference applied between the source region and the drain region.

The first write control signals of the integrated circuit device of an embodiment include a signal applied to the gate, wherein the signal applied to the gate includes a first voltage having a first amplitude and a second voltage having a second amplitude.

The first write control signals of the integrated circuit device of an embodiment include a signal applied to the gate, a signal applied to the source region, and a signal applied to the drain region to cause, provide, produce and/or induce the first source current, wherein one or more of: the signal applied to the source region includes a first voltage having a first amplitude; the signal applied to the drain region includes a second voltage having a second amplitude; and the signal applied to the gate includes a third voltage having a third amplitude and a fourth voltage having a fourth amplitude.

The first write control signals of the integrated circuit device of an embodiment include a first potential difference applied between the source region and the drain region and a signal applied to the gate that includes a first voltage, wherein the first write control signals may cause, provide, produce and/or induce an accumulation of minority carriers in the first portion of the body region.

The minority carriers of the integrated circuit device of an embodiment accumulate at a surface region of the first portion of body region that is juxtaposed or near a gate dielectric which is disposed between the gate and the first portion of the body region.

The minority carriers of the integrated circuit device of an embodiment accumulate at a surface region of the first portion of the body region, wherein the surface region is disconnected from the source region by the second portion of the body region.

The minority carriers of the integrated circuit device of an embodiment accumulate at a surface region of the first portion of the body region, wherein the surface region is disconnected from the drain region by the third portion of the body region.

The first write control signals of the integrated circuit device of an embodiment cause, provide, produce and/or induce source current in the body region as a result of impact ionization induced by the minority carriers.

The signal applied to the gate of the integrated circuit device of an embodiment temporally changes to a second voltage that causes, provides, produces and/or induces an accumulation of majority carriers in the first portion of the body region, wherein the majority carriers result in the first data state.

The second write control signals of the integrated circuit device of an embodiment include a second potential difference applied between the source region and the drain region and a signal applied to the gate that includes the first voltage, wherein the second write control signals prevent the first data state from being written into the first portion of the body transistor.

The second potential difference of the integrated circuit device of an embodiment is relatively less than the first potential difference.

The integrated circuit device of an embodiment comprises data sense circuitry coupled to the memory cell and configured to sense the data state of the memory cell, wherein, in response to read control signals applied to the memory cell, the transistor generates a second source current which is representative of the data state of the memory cell, wherein the data sense circuitry determines the data state of the memory cell at least substantially based on the second source current.

The read control signals of the integrated circuit device of an embodiment include a signal applied to the gate, source region, and drain region to cause, force and/or induce the source current which is representative of the data state of the memory cell.

The read control signals of the integrated circuit device of an embodiment include a first potential difference applied between the source region and the drain region.

The signal applied to the gate region of the integrated circuit device of an embodiment includes a negative voltage pulse.

Aspects of the present inventions described herein, and/or embodiments thereof, may include an integrated circuit device comprising one or more of: a memory cell array including one or more of a plurality of word lines, plurality of source lines, plurality of bit lines, and plurality of memory cells arranged in a matrix of rows and columns; wherein each memory cell includes a transistor comprising one or more of a body region configured to be electrically floating, a gate disposed over a first portion of the body region, the gate coupled to an associated word line, a source region adjoining a second portion of the body region, the second portion adjacent the first portion and separating the source region from the first portion, the source region coupled to an associated source line, and a drain region adjoining a third portion of the body region, the third portion adjacent the first portion and separating the drain region from the first portion, the drain region coupled to an associated bit line, wherein each memory cell includes a first data state representative of a first charge in the first portion of the body region, wherein each memory cell includes a second data state representative of a second charge in the first portion of the body region, wherein the source region of each memory cell of a first row of memory cells is connected to a first source line; data write circuitry coupled to the memory cells of the first row of memory cells, the data write circuitry configured to apply first write control signals to memory cells of the first row of memory cells to write the first data state and second write control signals to memory cells of the first row of memory cells to write the second data state, wherein, in response to first write control signals applied to at least a portion of the memory cells of the first row of memory cells, the electrically floating body transistor of each memory cell of the portion of the memory cells of the first row of memory cells generates a first source current which at least substantially provides the first charge in the first body region of the electrically floating body transistor of the portion of the memory cells of the first row of memory cells.

The source region of each memory cell of a second row of memory cells of the integrated circuit device of an embodiment is connected to the first source line.

The integrated circuit device of an embodiment comprises one or more of: the source region of each memory cell of a second row of memory cells connected to a second source line; the source region of each memory cell of a third row of memory cells connected to a second source line, wherein the second and third rows of memory cells are adjacent to the first row of memory cells.

The first write control signals of the integrated circuit device of an embodiment cause, provide, produce and/or induce the first source current.

The first write control signals of the integrated circuit device of an embodiment include a signal applied to the gate and a signal applied to the source region, wherein the signal applied to the gate includes a first voltage having a first amplitude and a second voltage having a second amplitude.

The first write control signals of the integrated circuit device of an embodiment include a signal applied to the gate and a signal applied to the drain region, wherein the signal applied to the gate includes a first voltage having a first amplitude and a second voltage having a second amplitude.

The first write control signals of the integrated circuit device of an embodiment include a potential difference applied between the source region and the drain region.

The first write control signals of the integrated circuit device of an embodiment include a signal applied to the gate, wherein the signal applied to the gate includes a first voltage having a first amplitude and a second voltage having a second amplitude.

The data write circuitry of the integrated circuit device of an embodiment, prior to applying the first write control signals, applies the second write control signals to all of the memory cells of the first row of memory cells to write the second data state therein.

The data write circuitry of the integrated circuit device of an embodiment at least substantially simultaneously applies one or more of: the first write control signals to the portion of the memory cells of the first row of memory cells to write the first data state therein; and the second write control signals to the other portion of the memory cells of the first row of memory cells to write the second data state therein.

The first write control signals of the integrated circuit device of an embodiment include a signal applied to the gate, a signal applied to the source region, and a signal applied to the drain region of one or more memory cells of the first row of memory cells to cause, provide, produce and/or induce the first source current, wherein one or more of: the signal applied to the source region includes a first voltage having a first amplitude; the signal applied to the drain region includes a second voltage having a second amplitude; and the signal applied to the gate includes a third voltage having a third amplitude and a fourth voltage having a fourth amplitude.

The first write control signals of the integrated circuit device of an embodiment include a first potential difference applied between the source region and the drain region and a signal applied to the gate of one or more memory cells of the first row of memory cells that includes a first voltage, wherein the first write control signals may cause, provide, produce and/or induce an accumulation of minority carriers at a surface region of the first portion of the body region.

The surface region of the first portion of body region of the integrated circuit device of an embodiment is juxtaposed or near a gate dielectric which is disposed between the gate and the first portion of the body region.

The surface region of the integrated circuit device of an embodiment is disconnected from the source region by the second portion of the body region.

The surface region of the integrated circuit device of an embodiment is disconnected from the drain region by the third portion of the body region.

The first write control signals of the integrated circuit device of an embodiment cause, provide, produce and/or induce source current in the body region as a result of impact ionization induced by the minority carriers.

The signal applied to the gate of the integrated circuit device of an embodiment temporally changes to a second voltage that causes, provides, produces and/or induces an accumulation of majority carriers in the body region, wherein the majority carriers result in the first data state.

The integrated circuit device of an embodiment comprises data sense circuitry coupled to each memory cell of the plurality of memory cells and configured to sense the data state of the memory cells, wherein, in response to read control signals applied to the memory cells, the transistor of each memory cell generates a second source current which is representative of the data state of the memory cell, wherein the data sense circuitry determines the data state of the memory cell at least substantially based on the second source current.

The read control signals of the integrated circuit device of an embodiment include a signal applied to the gate, source region, and drain region to cause, force and/or induce the source current which is representative of the data state of the memory cell.

The read control signals of the integrated circuit device of an embodiment include a first potential difference applied between the source region and the drain region.

The signal applied to the gate region of the integrated circuit device of an embodiment includes a negative voltage pulse.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

As mentioned above, the illustrated/example voltage levels to implement the read and write operations are merely examples. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the source, drain or gate voltages) become or are positive and negative.

The illustrated/example voltage levels and timing to implement the write and read operations are merely examples. In this regard, in certain embodiments, the control signals increase the potential of electrically floating body region of the transistor of the memory cell which "turns on" or produces a source current in the transistor. In the context of a write operation, the source current generates majority carriers in the electrically floating body region which are then stored. In the context of a read operation, the data state may be determined primarily by, sensed substantially using and/or based substantially on the source current that is responsive to the read control signals and significantly less by the interface channel current component, which is less significant and/or negligible relatively to the bipolar component.

As mentioned above, each of the aspects of the present inventions, and/or embodiments thereof, may be employed alone or in combination with one or more of such aspects and/or embodiments. For the sake of brevity, those permutations and combinations will not be discussed separately herein. As such, the present inventions are neither limited to any single aspect (nor embodiment thereof), nor to any combinations and/or permutations of such aspects and/or embodiments.

Moreover, the above embodiments of the present inventions are merely example embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the example embodiments of the inventions has been presented for the purposes of illustration and description. Many modifications and variations are possible in light of the above teaching. It is intended that the scope of the inventions not be limited solely to the description above.

The invention claimed is:

1. An integrated circuit device comprising:
a memory cell including a transistor, the transistor comprising:
a body region configured to be electrically floating;
a gate disposed over a first portion of the body region;
a source region adjoining a second portion of the body region, the second portion adjacent the first portion and separating the source region from the first portion; and
a drain region adjoining a third portion of the body region, the third portion adjacent the first portion and separating the drain region from the first portion;
wherein the memory cell is configured to store a first data state representative of a first charge in the first portion of the body region;
wherein the memory cell is configured to store a second data state representative of a second charge in the first portion of the body region; and
data write circuitry coupled to the memory cell, the data write circuitry configured to apply first write control signals to the memory cell to write the first data state to the memory cell and second write control signals to the memory cell to write the second data state to the memory cell, wherein, in response to first write control signals, the electrically floating body transistor generates a first source current which substantially provides the first charge in the first portion of the body region.

2. The integrated circuit device of claim 1, wherein the first write control signals cause the first source current.

3. The integrated circuit device of claim 1, wherein the first write control signals include a signal applied to the gate and a signal applied to the source region, wherein the signal applied to the gate includes a first voltage having a first amplitude and a second voltage having a second amplitude.

4. The integrated circuit device of claim 1, wherein the first write control signals include a signal applied to the gate and a signal applied to the drain region, wherein the signal applied to the gate includes a first voltage having a first amplitude and a second voltage having a second amplitude.

5. The integrated circuit device of claim 1, wherein the first write control signals cause a potential difference between the source region and the drain region.

6. The integrated circuit device of claim 5, wherein the first write control signals include a signal applied to the gate, wherein the signal applied to the gate includes a first voltage having a first amplitude and a second voltage having a second amplitude.

7. The integrated circuit device of claim 1, wherein the first write control signals include a signal applied to the gate, a signal applied to the source region, and a signal applied to the drain region to cause the first source current, wherein:
the signal applied to the source region includes a first voltage having a first amplitude;
the signal applied to the drain region includes a second voltage having a second amplitude; and
the signal applied to the gate includes a third voltage having a third amplitude and a fourth voltage having a fourth amplitude.

8. The integrated circuit device of claim 1, wherein the first write control signals cause a first potential difference between the source region and the drain region and include a signal applied to the gate that includes a first voltage, wherein the first write control signals cause an accumulation of minority carriers in the first portion of the body region.

9. The integrated circuit device of claim 8, wherein the minority carriers accumulate at a surface region of the first portion of body region that is disposed near a gate dielectric, which is disposed between the gate and the first portion of the body region.

10. The integrated circuit device of claim 8, wherein the minority carriers accumulate at a surface region of the first portion of the body region, wherein the surface region is disconnected from the source region by the second portion of the body region.

11. The integrated circuit device of claim 8, wherein the minority carriers accumulate at a surface region of the first portion of the body region, wherein the surface region is disconnected from the drain region by the third portion of the body region.

12. The integrated circuit device of claim 8, wherein the first write control signals cause the first source current in the body region as a result of impact ionization induced by the minority carriers.

13. The integrated circuit device of claim 8, wherein the signal applied to the gate temporally changes to a second voltage that causes an accumulation of majority carriers in the first portion of the body region, wherein the majority carriers result in the first data state.

14. The integrated circuit device of claim 8, wherein the second write control signals cause a second potential difference between the source region and the drain region and include a signal applied to the gate that includes the first voltage, wherein the second write control signals prevent the first data state from being written into the first portion of the body transistor.

15. The integrated circuit device of claim 8, wherein the second potential difference is relatively less than the first potential difference.

16. The integrated circuit device of claim 1, comprising data sense circuitry coupled to the memory cell and configured to sense the data state of the memory cell, wherein, in response to read control signals applied to the memory cell, the transistor generates a second source current which is representative of the data state of the memory cell, wherein the data sense circuitry determines the data state of the memory cell at least substantially based on the second source current.

17. The integrated circuit device of claim 16, wherein the read control signals include signals applied to one or more of the gate, source region, and drain region to cause the second source current which is representative of the data state of the memory cell.

18. The integrated circuit device of claim 16, wherein the read control signals cause a first potential difference between the source region and the drain region.

19. The integrated circuit device of claim 18, wherein the signal applied to the gate includes a negative voltage pulse.

20. The integrated circuit device of claim 1, wherein the source region of the memory cell is connected to a source region of one or more additional memory cells in a row of memory cells in the integrated circuit device.

* * * * *